(12) United States Patent
Maeda et al.

(10) Patent No.: US 6,275,107 B1
(45) Date of Patent: Aug. 14, 2001

(54) DIFFERENTIAL AMPLIFIER CIRCUIT AND PULL UP-TYPE DIFFERENTIAL DRIVER

(75) Inventors: Junko Maeda; Naoaki Naka, both of Kawasaki (JP)

(73) Assignee: Fujitisu Limited, Kawasaki (JP)

( * ) Notice: Subject to any disclaimer, the term of this patent is extended or adjusted under 35 U.S.C. 154(b) by 0 days.

(21) Appl. No.: 09/399,222

(22) Filed: Sep. 17, 1999

(30) Foreign Application Priority Data

Oct. 29, 1998 (JP) .................................................. 10-309014
Oct. 30, 1998 (JP) .................................................. 10-309952

(51) Int. Cl.⁷ ....................................................... H03F 3/45
(52) U.S. Cl. ........................................... 330/253; 330/261
(58) Field of Search ..................................... 330/253, 254, 330/261

(56) References Cited

U.S. PATENT DOCUMENTS 5,451,898 * 9/1995 Johnson ........................... 330/261 X

* cited by examiner

Primary Examiner—Steven J. Mottola
(74) Attorney, Agent, or Firm—Arent Fox Kintner Plotkin & Kahn, PLLC

(57) ABSTRACT

A differential amplifier circuit comprising a pair of input MOS transistors, wherein inputs are supplied to the gates thereof, load circuits are connected to the drains thereof, and a current source is connected to the sources thereof, the current value of the current source is altered in line with variations in the characteristics of the input MOS transistors, thereby suppressing variations in the output level generated at the drain terminals of the input MOS transistors. In other words, unlike a conventional differential amplifier circuit, the current value of the current source is not kept to a uniform value, but rather is altered in accordance with the transistor characteristics generated by the manufacturing process.

3 Claims, 15 Drawing Sheets

First Embodiment

First Embodiment

Second Embodiment

Second Embodiment

Third Embodiment

Second and Third Embodiment

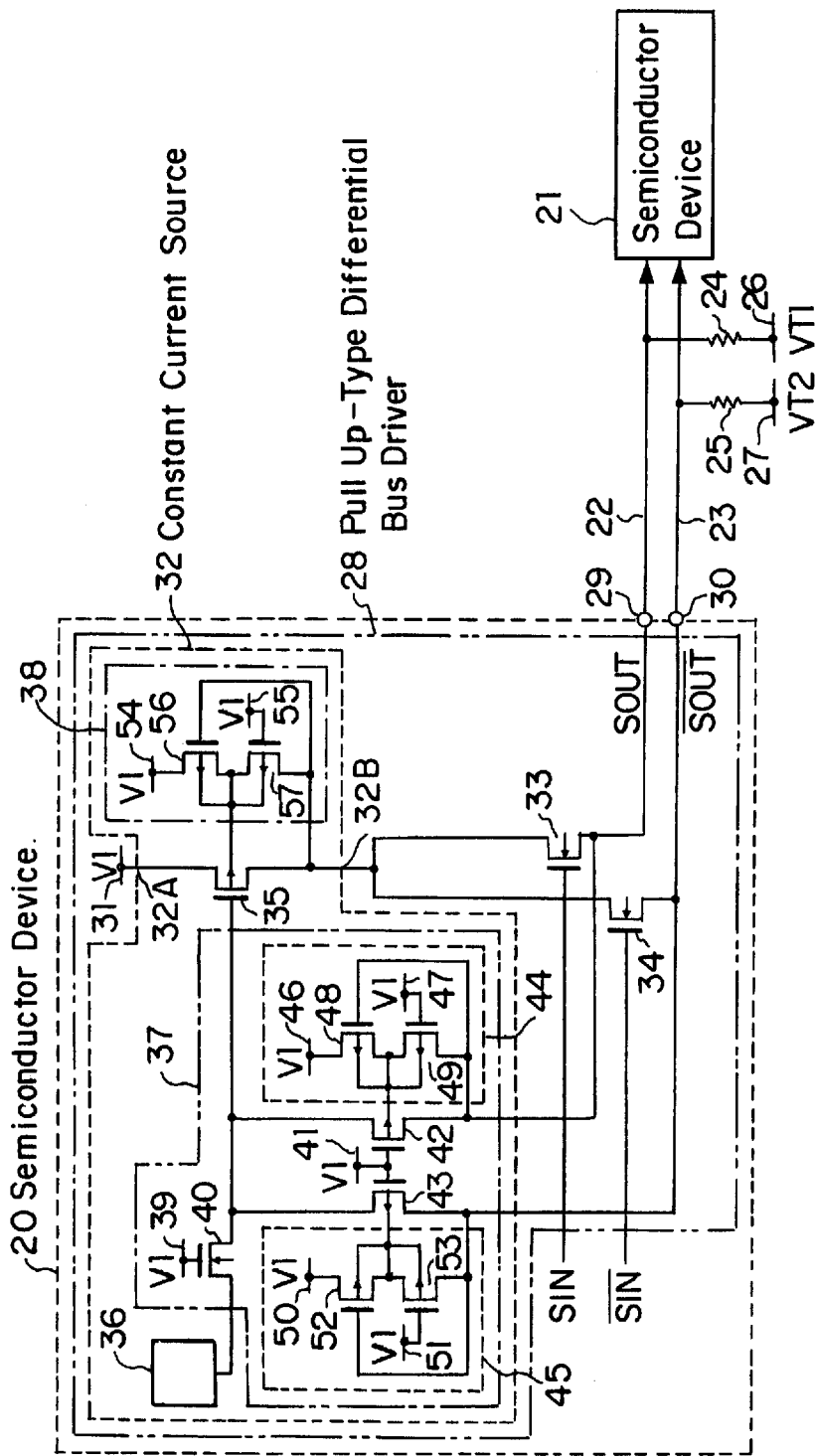
FIG. 11 Signal Transmission System including Pull Up-Type Differential Bus Driver of First Embodiment Signal Transmission System including Pull Up-Type Differential Bus Driver of Second Embodiment FIG. 13 Signal Transmission System including Pull Up-Type Differential Bus Driver of Third Embodiment Signal Transmission System including Pull Up-Type Differential Bus Driver of Fourth Embodiment Signal Transmission System including Pull Up-Type Differential Bus Driver of Fifth Embodiment

DIFFERENTIAL AMPLIFIER CIRCUIT AND PULL UP-TYPE DIFFERENTIAL DRIVER

BACKGROUND OF THE INVENTION

1. Field of the Invention

The present invention relates to a differential amplifier circuit or differential input circuit formed in a semiconductor substrate, and more particularly, to a differential amplifier circuit or differential input circuit which suppresses the effects of variations in transistor characteristics caused by variations in manufacture processing and is not influenced by level fluctuations in the differential input signal.

Moreover, the present invention relates to a pull up-type differential bus driver and a differential bus driving method suitable for use in cases where differential signals are transmitted between semiconductor chips.

2. Description of the Related Art

Differential amplifier circuits or differential input circuits (hereinafter, simply called differential amplifier circuits) comprising a pair of MOS transistors, differential inputs being supplied respectively to the gates thereof and an output being generated at the drains thereof, are widely used. In a differential amplifier circuit of this kind, a current source is connected to the source electrodes of a pair of MOS transistors and supplies a fixed current thereto, differential inputs supplied to the gates are compared and the conductivity of one of the pair of MOS transistors is raised whilst the conductivity of the other transistor is lowered.

In cases where signals of small amplitude, such as 100 mv, for example, or differential input signals having a large fluctuation in the central voltage of the amplitude are supplied as differential inputs, generally, the operation of the differential amplifier circuit is stabilized by holding the current from the aforementioned current source at a uniform value as far as possible.

FIG. 1 is a diagram showing an example of a conventional differential amplifier circuit. This differential amplifier circuit comprises: a pair of N-channel input MOS transistors N1, N2, wherein differential inputs IN, /IN are supplied respectively to the gates thereof and the sources thereof are connected mutually; load circuits L1, L2 provided between the drains thereof and a first power source Vdd; and a current source I1 provided between the sources and the second power source Vss. An amplified output is generated at the drain terminal n1 of transistor N2 in accordance with the differential inputs IN, /IN. This output n1 is supplied to the input of a CMOS inverter consisting of a P-channel MOS transistor P3 and N-channel MOS transistor N3.

FIG. 2 is a diagram showing a further example of a conventional differential amplifier circuit. This differential amplifier circuit also comprises a pair of input MOS transistors N1, N2, load circuits L1, L2, and a current source I1. Moreover, in the differential amplifier circuit in FIG. 2, the drain terminal n1 of the transistor N2 is connected to the gate of a P-channel output MOS transistor P4, and the junction point n3 between the output MOS transistor P4 and a current source I2 is supplied to the input of a CMOS inverter. This circuit differs from the differential amplifier circuit in FIG. 1 in that the signal n3, which is an inverse amplification of the signal from drain terminal n1, is supplied to a CMOS inverter.

In the aforementioned conventional differential amplifier circuit, if the voltage of input IN is lower than the inverse input /IN, then transistor N2 switches on and the voltage of node n1 assumes level L, whereas if, conversely, the voltage of input IN is higher than the inverse input /IN, then transistor N2 switches off and the voltage of node n1 assumes level H. In the differential amplifier circuit in FIG. 1, level L or level H is generated at output n2 of the inverter, in accordance with level H or level L at node n1. In the differential amplifier circuit in FIG. 2, level L or level H is generated at node n3 and level H or level L is generated at the output n2 of the inverter, respectively, in accordance with level H or level L at node n1.

FIG. 3 is a diagram illustrating problems associated with the prior art examples described above. FIG. 3A shows the relationship between the outputs n1, n3 of the aforementioned differential amplifier circuit and the threshold value VthC of the CMOS inverter, and FIG. 3B shows the voltage level of the output n2 of the CMOS inverter corresponding to same.

The outputs n1, n3 of the differential amplifier circuit assume level H and level L having prescribed amplitudes, without performing a full swing between the power sources Vdd and Vss. In contrast to this, the output n2 of the CMOS inverter does make a full swing, assuming either level H, which is the level of the higher power source Vdd, or level L, which is the level of the lower power source (ground) Vss. On the other hand, if the differential amplifier circuit is formed as part of an integrated circuit on a semiconductor substrate, then variations will arise in the characteristics of the MOS transistors due to variations in processing. For example, if a variation in characteristics arises whereby the drive capacity of N-channel MOS transistors is raised, then the impedance of the MOS transistor N2 when conducting will fall, and hence the central voltage of the amplitude at node n1 will tend to fall. In other words, it will deviate from the solid line in FIG. 3 and follow the dotted line. If, conversely, a variation in characteristics arises whereby the drive capacitor of the N-channel MOS transistor is reduced, then the impedance of the MOS transistor N2 when conducting will rise, and hence the central voltage of the amplitude at node n1 will tend to rise. In other words, it will deviate from the solid line in FIG. 3 and follow the broken line.

Upward or downward fluctuation in the central value of the amplitude of output n1 caused by variations in processing is particularly notable in cases where P-channel MOS transistors are used in the load circuits L1, L2 and the drive capacity of the P-channel MOS transistors varies in the opposite direction to the variation in the drive capacity of the N-channel MOS transistors. Even in cases where P-channel output MOS transistors are provided as illustrated in FIG. 2, the central value of the amplitude at output n3 will similarly vary either in an upward or downward direction due to variations in processing.

If the outputs n1 or n3 from the differential amplifier circuit vary as illustrated in FIG. 3, then either one of the P-channel transistor P3 or N-channel transistor N3 in the subsequent CMOS inverter driven by these outputs n1, n3, will not be able completely to assume a non-conducting state, thereby resulting in a through current from power source Vdd to Vss in the CMOS inverter. The generation of through current in this way, in addition to increasing power consumption, also leads to problems in that the output n2 of the CMOS inverter cannot be amplified completely to the power source level.

Moreover, to describe a second problem, when the outputs n1, n3 of the differential amplifier circuit are higher than the threshold voltage VthC of the CMOS inverter, as illustrated in FIG. 3, the output thereof assumes level L, whereas when outputs n1, n3 are lower than VthC, then the output assumes level H. However, if the voltage of the outputs n1, n3 of the differential amplifier circuit vary upwards or downwards as shown in FIG. 3 due to processing in manufacture, then the timing of level H or level L of the input with respect to the threshold voltage of the CMOS inverter will differ. As a result, the input rise propagation delay time and the input fall propagation delay time in the CMOS inverter will run contrary to each other, leading to significant variations in characteristics during high-speed operation. Since the threshold voltage VthC of the CMOS inverter is a value determined by the ratio of current values in the P-channel transistor P3 and the N-channel transistor N3, this threshold voltage VthC also varies with fluctuations in transistor characteristics. However, the magnitude of this variation in threshold voltage is small compared to the variations in the output level of the differential amplifier circuit.

A third problem is that when there is a variation in the central voltage of the amplitude of the differential inputs to the differential amplifier circuit, this impedes the differential operation of the input transistors of the differential amplifier circuit. For example, in some cases, a differential input from an external circuit having a different power system may become extremely low if the power system of the semiconductor device in which the differential amplifier circuit is provided is taken as a reference. For instance, if the differential input has an amplitude of the order of 100 mV whilst the central value of the amplitude of the external differential input takes a low value of approximately 1 V, for example, then the gate-source voltage in the N-channel input transistors N1, N2 of the differential amplifier circuit will become lower than the threshold voltage of the transistors and both transistors N1 and N2 will assume a non-conducting state. Consequently, it will become impossible to conduct a voltage comparison operation with respect to the differential inputs. Input transistors N1, N2 are generally of an enhancement-type composition, and therefore differential input signals supplied to the gates thereof need to having a central value level which is a certain degree higher than the ground voltage Vss.

FIG. 16 is a circuit diagram showing the principal part of one example of a signal transmission system containing one example of a conventional pull up-type differential bus driver. In FIG. 16, 1 is a semiconductor device forming a driver, 2 is a semiconductor device forming a receiver, 3 and 4 are signal lines providing a connection between semiconductors 1 and 2, 5 and 6 are terminal resistances, 7 is a terminal voltage line supplying terminal voltage VT1, and 8 is a terminal voltage line supplying terminal voltage VT2.

In the semiconductor device 1, 9 is a conventional pull up-type differential bus driver, SIN and /SIN are differential input signals input from the internal circuitry (not illustrated) to the pull up-type differential bus driver 9, and 10 and 11 are signal output terminals whereby the differential output signals SOUT, /SOUT are output from the pull up-type differential bus driver 9.

Furthermore, in the pull up-type differential bus driver 9, 12 is a power source line supplying power voltage V1, 13 is a constant current source, 14 denotes switching means which switches on and off in accordance with the input signal SIN, and 15 denotes switching means which switches on and off in accordance with the input signal /SIN.

In a signal transmission system constituted in this way, when the input signal SIN is at level H and input signal /SIN is at level L, then switching means 14 turns on and switching means 15 turns off, and hence the signal line 3 is pulled up by the current output from the constant current source 13 and a level H signal is transmitted in the signal line 3, whilst the signal line 4 is pulled down via terminal resistance 6 and a level L signal is transmitted in the signal line 4.

If, on the other hand, the input signal SIN is at level L and input signal ISIN is at level H, then switching means 14 turns off and switching means 15 turns on, and hence the signal line 3 is pulled down via terminal resistance 6 and a level L signal is transmitted in signal line 3, whilst signal line 4 is pulled up by the current output from fixed current source 13 and a level H signal is transmitted in signal line 4.

In the signal transmission system illustrated in FIG. 16, no problems occur when the terminal voltages VT1, VT2 are lower then the power voltage V1, but it is conceivable that, for a reason of any kind, terminal voltage VT1 or terminal voltage VT2 may increase and become higher than power voltage V1, or that the power voltage V1 may fall such that terminal voltage VT1 or terminal voltage VT2 becomes higher than power voltage In such cases where the terminal voltage VT1 or terminal voltage VT2 has become higher than the power voltage V1 and the voltage in signal line 3 or the voltage in signal line 4 has become higher than the power voltage V1, there is a risk that, in the semiconductor device 1, a current will flow into the power line 12 via switching means 14 or switching means 15, and the constant current source 13, thereby leading to malfunction.

Therefore, it is an object of the present invention to provide a differential amplifier circuit or differential input circuit whereby fluctuations in output level are suppressed even when there are variations in transistor characteristics due to the manufacturing process, or the like.

It is a further object of the present invention to provide a differential amplifier circuit or differential input circuit whereby a differential amplification operation can be carried out correctly, even in cases where the central values of the amplitude of the differential input signals differ widely.

It is also an object of the present invention to provide a pull up-type differential driver which is devised such that there is no influx of current from the signal line side to the power source side, even if, for any reason, the voltage in the signal lines has become higher than the power voltage, thereby providing increased reliability and avoiding malfunctions due to influx of current from the signal line side to the power source side in cases where a pull up-type differential bus driver is installed in a designated semiconductor device.

Moreover, it is a further object of the present invention to provide a differential driving method which is devised such that there is no influx of current from the signal line side to the power source side even when, for any reason, the voltage in the signal lines has become higher than the power voltage, thereby providing increased reliability and avoiding malfunctions due to influx of current from the signal line side to the power source side in cases where a pull up-type differential bus driver is installed in a designated semiconductor device.

SUMMARY OF THE INVENTION

In order to achieve the aforementioned object, a first aspect of the invention is characterized in that, in a differential amplifier circuit comprising a pair of input MOS transistors, wherein inputs are supplied to the gates thereof, load circuits are connected to the drains thereof, and a current source is connected to the sources thereof, the current value of the current source is altered in line with variations in the characteristics of the input MOS transistors, thereby suppressing variations in the output level generated at the drain terminals of the input MOS transistors. In other words, unlike a conventional differential amplifier circuit, the current value of the current source is not kept to a uniform value, but rather is altered in accordance with the transistor characteristics generated by the manufacturing process.

More specifically, in a case where the input MOS transistors are N-channel transistors, a current source circuit is provided which suppresses the current value, if, due to the manufacturing process, the N-channel transistors vary such that the current drive capacity thereof rises, and which raises the current value, if the N-channel transistors vary such that the current drive capacity thereof declines. The output level of the drain terminals is determined by the ratio between the impedance of the load circuits and the impedance of the input transistors. Therefore, in cases where the current drive capacity of the N-channel transistors rises and the impedance thereof declines, a fall in the output level is suppressed by reducing the current value of the current source. Conversely, in a case where the current drive capacity of the N-channel transistors declines and the impedance thereof rises, an increase in the output level is suppressed by raising the current value of the current source.

In order to achieve the aforementioned objects, a first aspect of the invention is a differential amplifier circuit, formed in a common semiconductor substrate, for comparing inputs and generating an amplified output, comprising: a pair of input MOS transistors of a first conductor type, the gates of which are supplied respectively with a first and a second input, the drains of which are connected respectively via load circuits to a first power source, and the sources of which are connected mutually; and a current source, provided between the sources and the second power source, for supplying current to the sources; wherein the current source supplies a first current, in the case of a first state where the drive capacity of the MOS transistors of the first conductor type varies above direction against that of MOS transistors of a second conductor type opposite to the first conductor type, and supplies a second current, which is greater than the first current, in the case of a second state where the drive capacity of the MOS transistors of the first conductor type varies below direction against that of the MOS transistors of the second conductor type.

Moreover, in order to achieve the aforementioned objects, a second aspect of the invention comprises, in addition to the pair of input transistors to which differential input signals are supplied, a pair of input transistors of opposite conductor type to the pair of input transistors. The output terminals of the output transistors, which generate an inverse output when the drain signals of the input transistors are supplied thereto, are connected to the drains of the pair of input transistors of the opposite conductor type. According to a differential amplifier circuit having this composition, even if the central value of the amplitude of the differential input signals takes a variety of levels, since one or other of the pairs of input transistors will perform a differential amplification operation, it is possible to respond to differential input signals over a broad range.

In order to achieve the aforementioned objects, the second aspect of the invention is a differential amplifier circuit, formed in a common semiconductor substrate, for comparing differential inputs and generating an amplified output, comprising: a pair of input MOS transistors of a first conductor type, the gates of which are supplied respectively with a first and a second input, the drains of which are connected respectively via load circuits to a first power source, and the sources of which are mutually connected to a first current source; a pair of output MOS transistors of a second conductor type, drain signals from the pair of input MOS transistors of the first conductor type being input respectively to the gates thereof, and a differential output being generated at the drains thereof; and a pair of input MOS transistors of a second conductor type, the gates of which are supplied respectively with the second and first inputs, the drains of which are connected respectively to the drains of the pair of output MOS transistors, and the sources of which are connected to the first power source via a second current source.

Moreover, by combining the differential amplifier circuit according to the second aspect of the invention and the differential amplifier circuit according to the first aspect of the invention, it is possible to receive differential input signals having a wide range, by receiving differential input signals by means of the differential amplifier circuit according to the second aspect of the invention and receiving the differential output signals from same by means of the differential amplifier circuit according to the first aspect of the invention, whereby an amplified output is generated, and hence it is possible to generate an output of a uniform level which has reduced susceptibility to the influence of manufacturing processes.

The pull up-type differential driver according to the present invention is a pull up-type differential driver comprising: a constant current source, the upstream terminal of which is connected to a power source line supplying a power voltage; first switch, one terminal of which is connected to the downstream terminal of the constant current source and the other terminal of which is connected to a first signal output terminal connected to a first signal line, the on/off switching of the first switch being controlled in accordance with one signal of differential input signals; and second switch, one terminal of which is connected to the downstream terminal of the constant current source and the other terminal of which is connected to a second signal output terminal connected to a second signal line, the on/off switching of the second switch being controlled in accordance with the other signal of the differential input signals; wherein the constant current source comprises a control circuit for implementing control such that there is no influx of current from either or both the first signal line side and/or the second signal line side to the power source side, when the voltage of either or both the first signal line and/or the second signal line has risen above the power source voltage.

According to the pull up-type differential driver of the present invention, since the constant current source is constituted such that it comprises a control circuit implementing control whereby there is no influx of current from either or both the first signal line side and/or the second signal line side to the power source side, when the voltage of either or both the first signal line and/or the second signal line has risen above the power source voltage, then it is possible to prevent influx of current from either or both the first signal line side and/or the second signal line side to the power source side, if, for any reason, the voltage of either or both the first signal line and/or the second signal line has risen above the power voltage.

The differential driving method according to the present invention is a differential driving method for driving a first signal line and a second signal line, using a pull up-type differential bus driver comprising: a constant current source, the upstream terminal of which is connected to a power source line supplying a power voltage; first switch, one terminal of which is connected to the downstream terminal of the fixed current source and the other terminal of which is connected to a first signal output terminal connected to a first signal line, the on/off switching of the first switch being controlled in accordance with one signal of differential input signals; and second switch, one terminal of which is connected to the downstream terminal of the fixed current source and the other terminal of which is connected to a second signal output terminal connected to a second signal line, the on/off switching of the second switch being controlled in accordance with the other signal of the differential input signals; comprising the step of: implementing control such that there is no influx of current from either or both the first signal line side and/or the second signal line side to the power source side, when the voltage of either or both the first signal line and/or the second signal line has risen above the power source voltage.

Since the differential driving method of the present invention comprises the step of implementing control such that there is no influx of current from either or both the first signal line side and/or the second signal line side to the power source side, when the voltage of either or both the first signal line and/or the second signal line has risen above the power source voltage, then it is possible to prevent influx of current from either or both the first signal line side and/or the second signal line side, if, for any reason, the voltage of either or both the first signal line and/or the second signal line has risen above the power source voltage.

BRIEF DESCRIPTION OF THE DRAWINGS

FIG. 11 is a circuit diagram showing the principal part of one example of a signal transmission system comprising a first embodiment of a pull up-type differential bus driver according to the present invention;

DESCRIPTION OF THE PREFERRED EMBODIMENTS

Below, embodiments of the present invention are described with reference to the drawings. However, the technical scope of the present invention is not limited by these embodiments.

First aspect of the invention: differential amplifier circuit

First Embodiment

Figure 4:
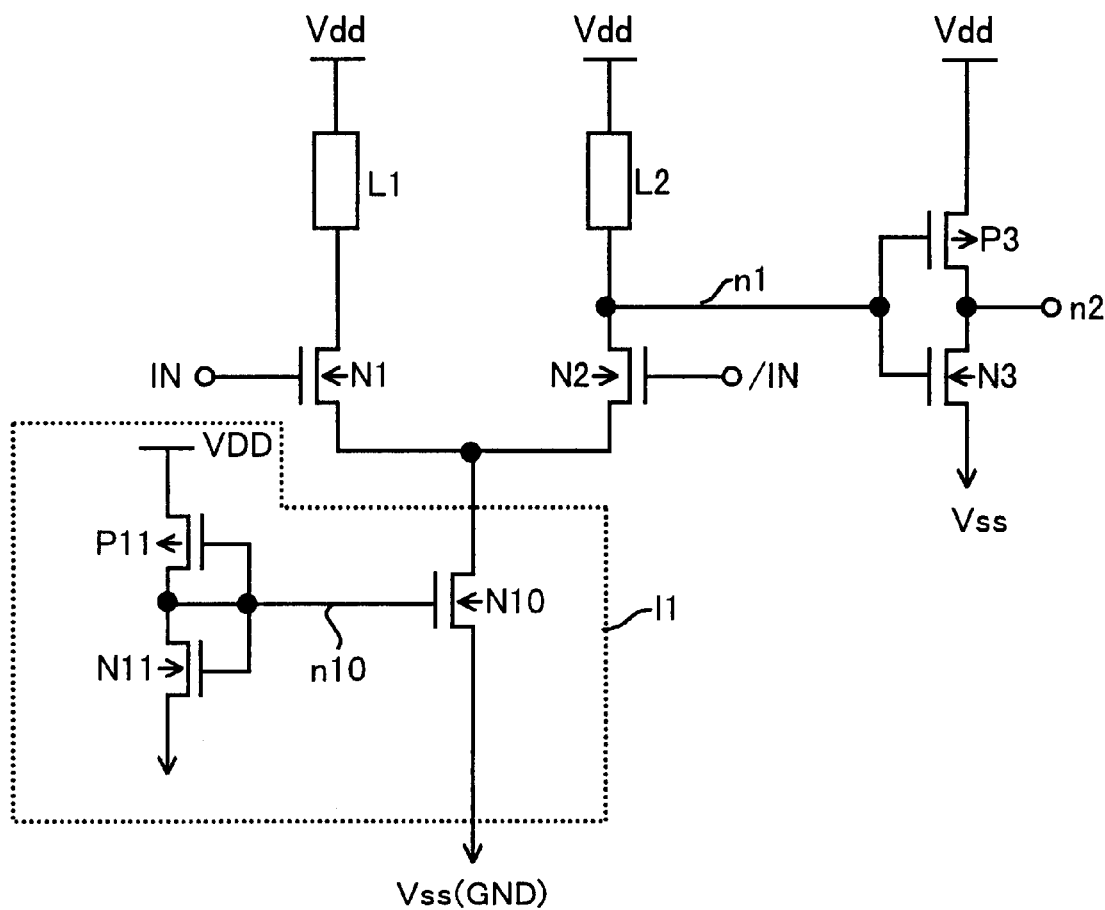
FIG. 4 is a diagram illustrating a differential amplifier circuit according to a first embodiment.

FIG. 4 is a diagram showing a differential amplifier circuit according to a first embodiment of the differential amplifier circuit according to the present invention. The differential amplifier circuit in FIG. 4 comprises an N-channel input transistor N1 and an N-channel input transistor N2, a first input IN and a second input /IN being supplied respectively to the gates thereof. The sources of these transistors N1, N2 are mutually connected and are connected to the current source circuit I1. Load circuits L1, L2 are connected respectively between the drains of the transistors N1, N2 and a power source Vdd. In this example, the output of the drain terminal n1 of transistor N2 is supplied to a subsequent CMOS inverter.

In the differential amplifier circuit in FIG. 4, if the current drive capability of the N-channel MOS transistors is greater than the current drive capability of the P-channel MOS transistors, due to manufacturing variations, or the like, then the amount of current from the current source I1 is reduced. Moreover, if, conversely, the current drive capability of the N-channel MOS transistors is less than the current drive capability of the P-cahnnel MOS transistors, then the amount of current from the current source I1 is increased.

The circuitry in the current source I1 comprises an N-channel transistor N10 supplying a current to the common source terminals of transistors N1, N2, and P-channel transistor P11 and N-channel transistor N11 connected in series between power sources Vdd and Vss. Both the gates and the drains of the transistors P11, N11 are connected mutually, and the connected drains are further connected to the gate of transistor N10.

Supposing now a first state wherein the current drive capacity of the N-channel MOS transistors varies above direction comparing to the current drive capacity of the P-channel MOS transistors, due to manufacturing variations, or the like, then the impedance of the N-channel MOS transistor N11 will vary towards a lower value comparing to the impedance of the P-channel MOS transistor P11. Consequently, the voltage at the drain terminal n10 of this transistor falls and the current in the N-channel transistor N10 is reduced. Thereby, the impedance of the transistor N10 increases, cancelling out the downward variation in the impedance of transistor N2 and hence suppressing fluctuation in the level at the drain terminal n1.

If a second state is supposed, wherein the current drive capability of the N-channel MOS transistor is less than the current drive capability of the P-channel MOS transistors, due to manufacturing variations, or the like, then the impedance of the N-channel transistor N11 will vary towards a higher value comparing to the impedance of the P-channel transistor P11. Consequently, the voltage at the drain terminal n10 of this transistor becomes greater and the current in the N-channel transistor N10 increases. Thereby, the impedance of the transistor N10 falls, canceling out the upward variation in the impedance of transistor N2 and hence suppressing fluctuation in the level of the drain terminal n1.

Figure 2:
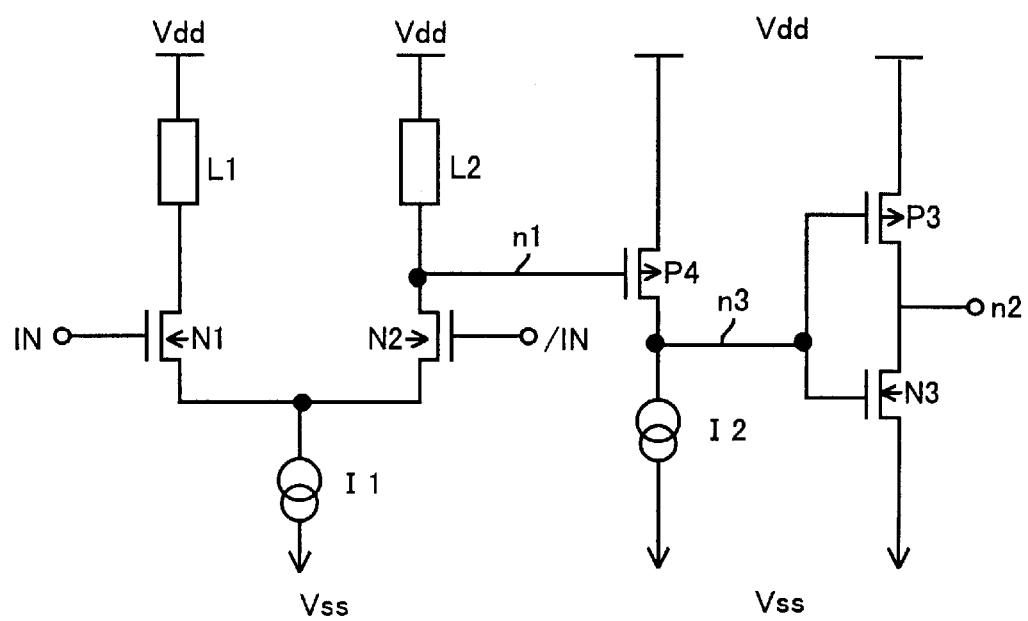
FIG. 2 is a diagram showing a further example of a conventional differential amplifier circuit.

A similar action and effect is obtained even if an output circuit comprising a P-channel transistor is inserted in between node n1 of the differential amplifier circuit in FIG. 4 and the subsequent cMOS inverter, as illustrated in FIG. 2. However, in this case, the output signal is reversed.

Figure 5A:
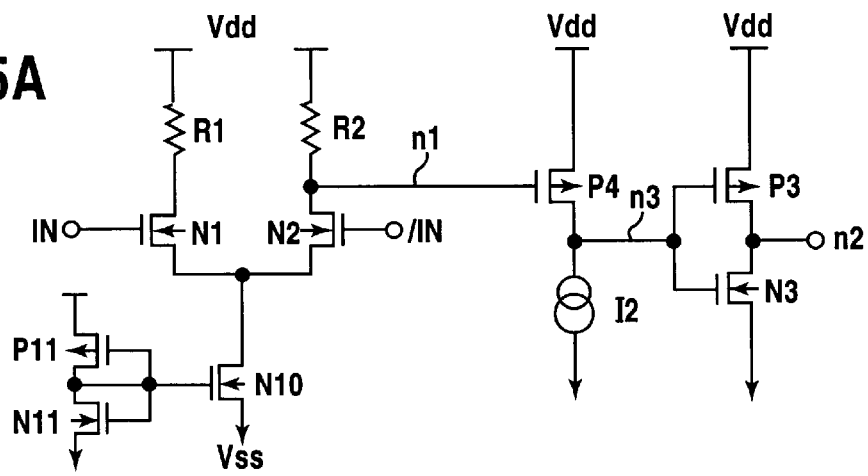
FIG. 5 is a diagram illustrating a differential amplifier circuit according to a first embodiment.

FIG. 5 is a diagram showing a differential amplifier circuit according to a first embodiment. FIG. 5 shows examples of three types of load circuits, FIG. 5A being an example wherein an output circuit comprising P-channel transistor P4 is provided. Parts corresponding to the differential amplifier circuit in FIG. 4 are given the same reference numerals.

In the example in FIG. 5A, the load circuits are constituted by resistances R1, R2. The drain terminal n1 of the transistor N2 is supplied to the gate of the P-channel transistor P4 in the output circuit, and the junction point n3 between transistor P4 and current source I2 is supplied to a subsequent CMOS inverter. In this case, variation at the drain terminal n1 is suppressed by the current source circuit constituted by transistors N10, P11 and N11, and therefore fluctuation in the output n3 which is inversely amplified in accordance with the potential at n1 is also suppressed.

Figure 5B:
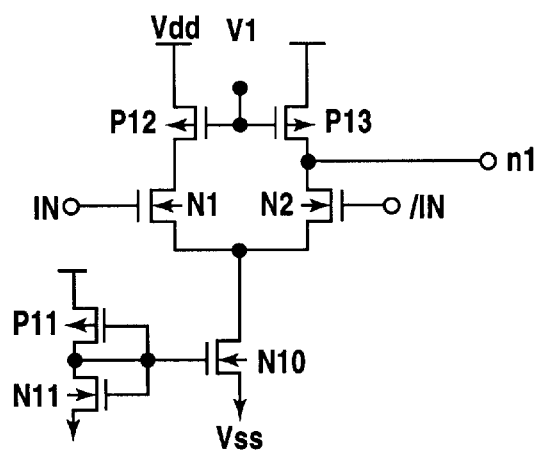

In the example in FIG. 5B, the load circuits are constituted by P-channel transistors P12, P13, the gates of which are supplied with a constant voltage V1. In the case of this example, in a first state wherein the current drive capability of the N-channel transistor is greater than the current drive capability of the P-channel transistors, this variation is manifested, since the voltage level of the drain terminal n1 is determined by the ratio between the impedances of the load transistor P13, input transistor N2 and current source transistor N10. However, in the circuit in FIG. 5B, the gate voltage of the transistor N10 will fall, and therefore the impedance of the current source transistor N10 will increase, canceling out the variation in impedance in transistors P13 and N2 and hence suppressing variations in the voltage level at the drain terminal n1. This applies similarly in the aforementioned second state.

Figure 5C:
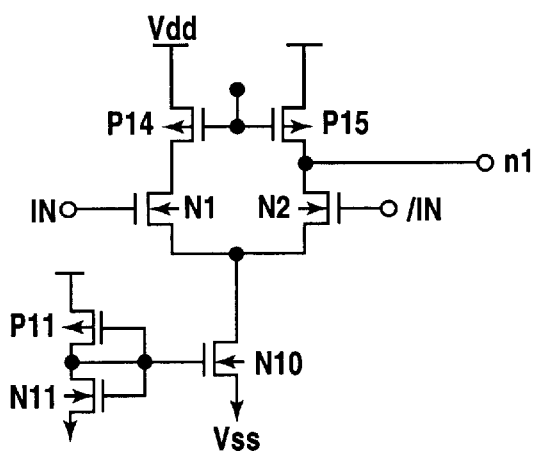

In the example in FIG. 5C, the load circuits are constituted by P-channel transistors P14, P15. The gates of transistors P14, P15 are connected to the drain of transistor P14. Consequently, a low-amplitude signal from transistor N1 generated in accordance with the difference between input signals IN and /IN is amplified by the transistor P15 and a signal of relatively high amplitude is output to the drain terminal n1. In the case of this example also, the voltage level of the output n1 varies with discrepancies in manufacturing, and the like, but variations in the voltage level of the output n1 are suppressed by the action of the current source circuit described above.

Figure 3A:
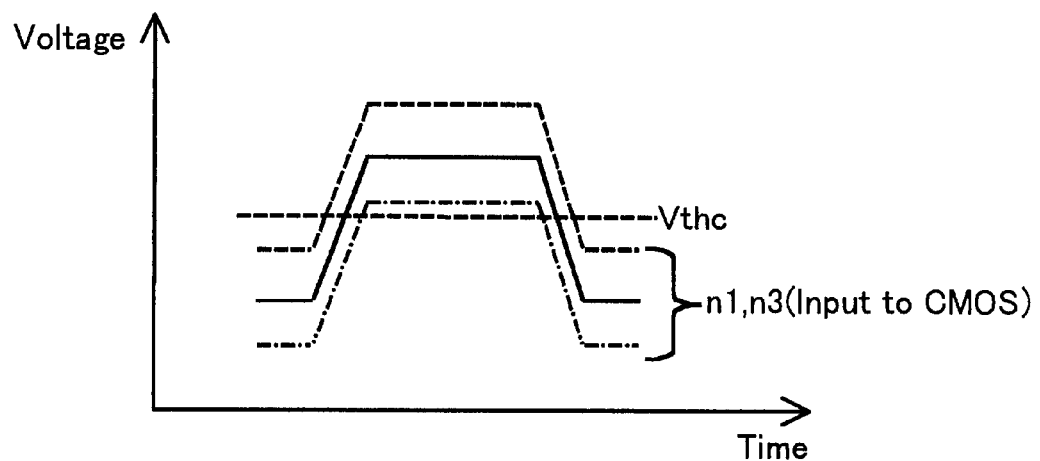
FIG. 3 is a diagram illustrating problems associated with the prior art.
Figure 3B:
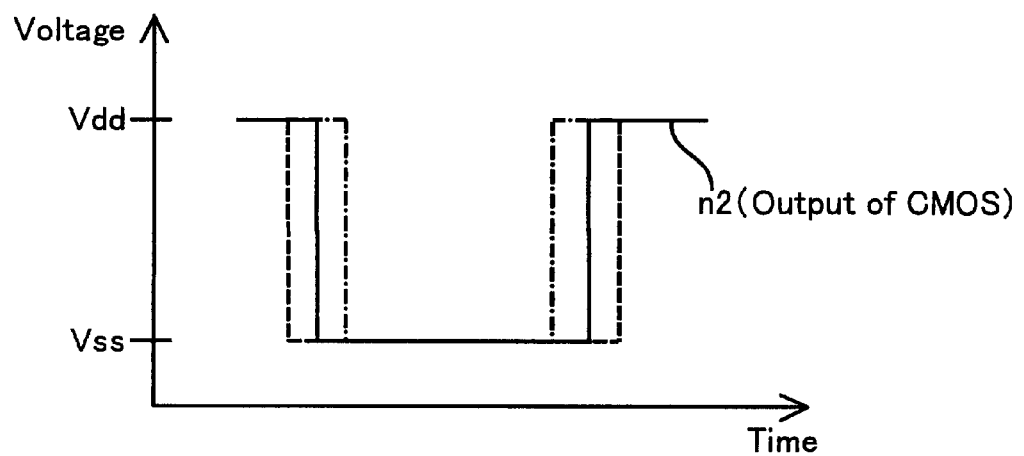

In the differential amplifier circuits according to the first embodiment, even if transistor characteristics vary due to discrepancies in manufacturing, or the like, variation in the central value of the output amplitude is prevented and the level indicated by the solid line in FIG. 3 is maintained. Consequently, the transistors constituting the subsequent CMOS inverter will switch off reliably and no through current will flow. Moreover, since outputs n1, n3 vary upwards and downwards to either side of the threshold voltage VthC of the subsequent CMOS inverter, there is no discrepancy between the input rise propagation delay time and fall propagation delay time, and hence no malfunction is caused during high-speed operation.

Figure 6:
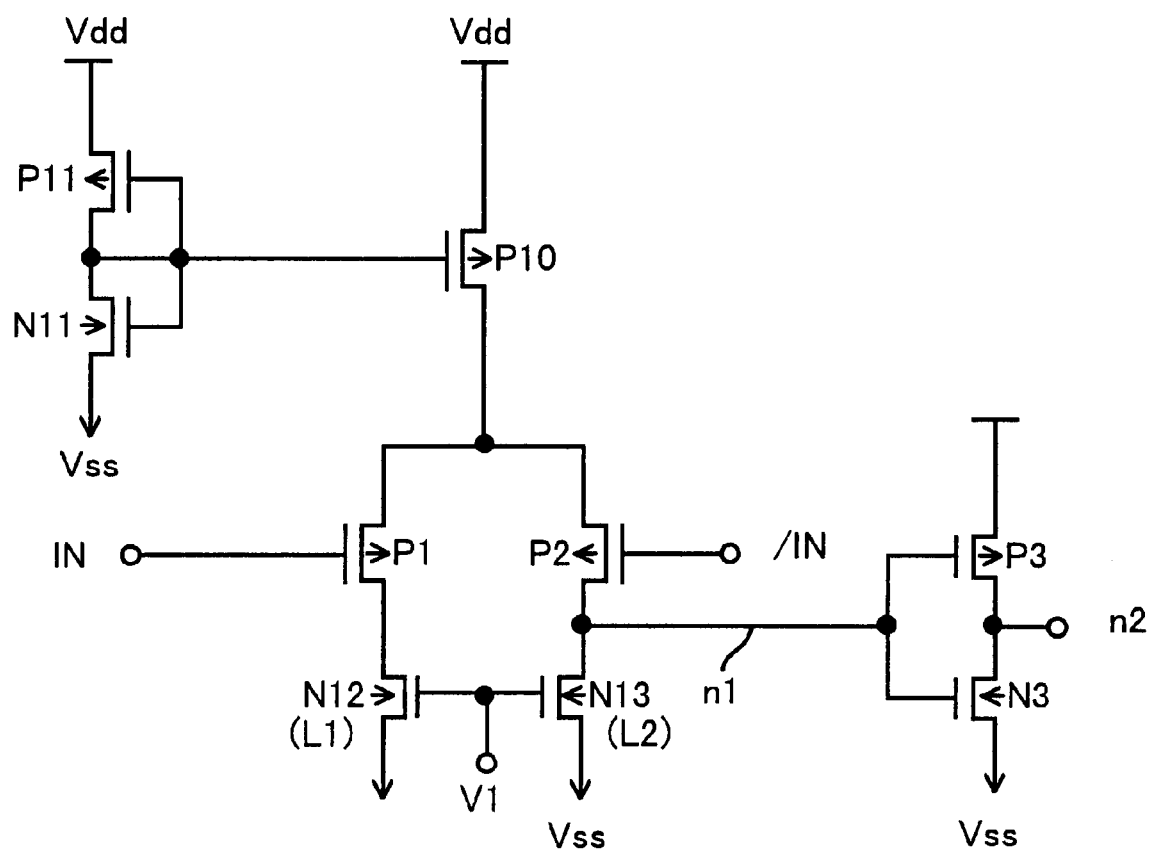
FIG. 6 is a diagram illustrating a further example of a differential amplifier circuit according to a first embodiment.

FIG. 6 is a diagram showing a further example of a differential amplifier circuit according to the first embodiment. This circuit is the same as the differential amplifier circuit in FIG. 4, with the exception that the conductor types of the transistors are reversed. Consequently, the same reference numerals have been used for corresponding sections. In the example in FIG. 6, P-channel transistors P1 and P2 constitute a pair of input transistors, the gates of which are supplied with inputs IN and /IN. A P-channel transistor P10 in a current source is connected to the common source of transistors P1 and P2. The drain terminals of a bias circuit comprising a P-channel transistor P11 and N-channel transistor N11 are connected to the gate of transistor P10.

N-channel transistors N12 and N13 are used as the load circuits L1, L2 in the example in FIG. 6. A uniform voltage V1 is supplied to the gates of these transistor N12, N13. However, it is also possible for other load circuits such as those illustrated in FIG. 5 to be connected.

In the differential amplifier circuit in FIG. 6, supposing that the current drive capacity of the P-channel transistors varies towards a higher value than that of the N-channel transistors, due to manufacturing variations, or the like, then the impedance of the transistor P2 will fall and the voltage level at the drain terminal n1 will rise. In this case, since the impedance of the transistor P11 in the bias circuit also falls, the level at the drain terminal will rise and the current value in the current source transistor P10 will be reduced. Thereby, the impedance of current source transistor P10 will increase, cancelling out the fall in impedance in the input transistor P2, and hence suppressing fluctuation in the level of the output n1. Even if the manufacturing variations are reversed, then fluctuations in the level of the output n1 will be suppressed in a similar manner.

In the example in FIG. 6, even if an output circuit comprising an N-channel transistor and a current source, which inversely amplifies the signal at the drain terminal n1, is provided between the drain terminal n1 and the subsequent CMOS inverter, fluctuations in the output level are still prevented in a similar manner.

Second Embodiment

Figure 7:
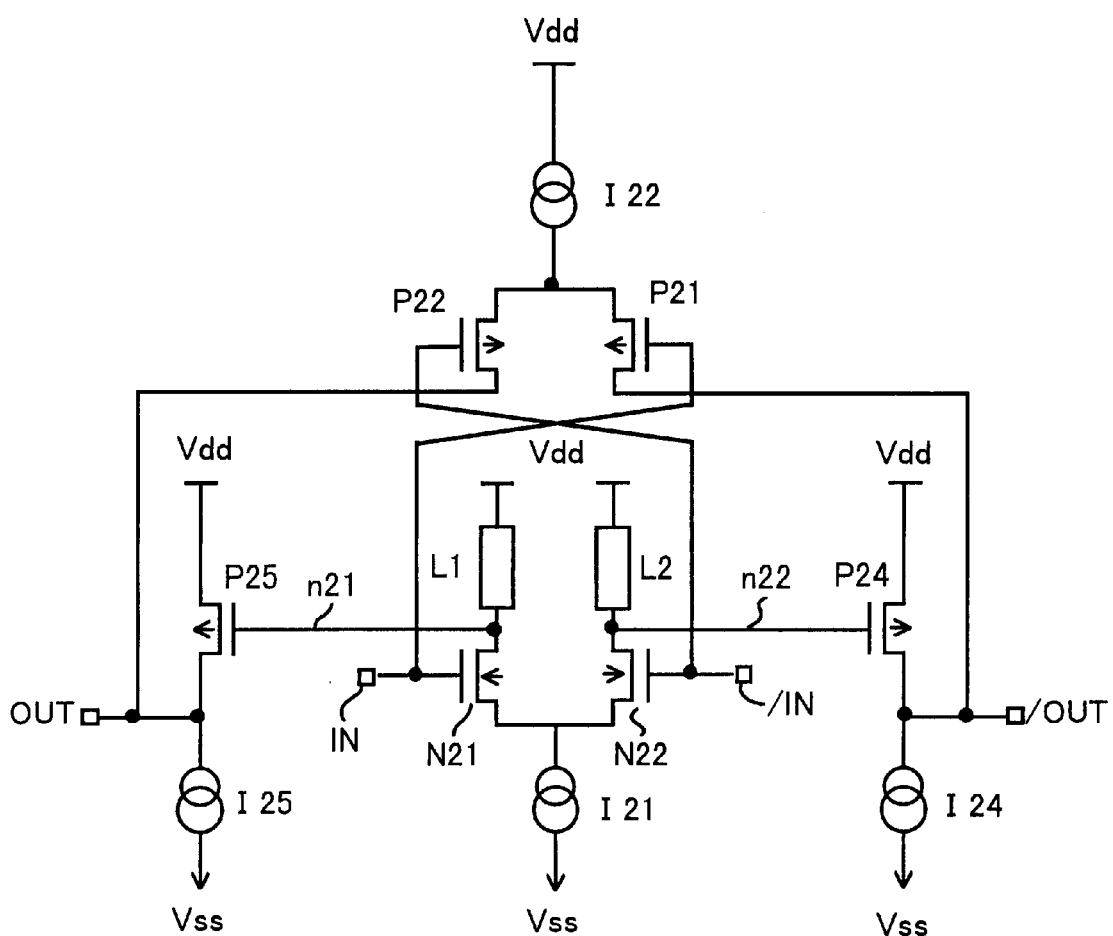
FIG. 7 is a diagram illustrating a differential amplifier circuit according to a second embodiment.

FIG. 7 is a diagram illustrating a differential amplifier circuit according to a second embodiment. The second embodiment corresponds to the second aspect of the invention. Specifically, this differential amplifier circuit is capable of performing a differential amplification operation correctly, even in cases where the differential inputs IN, /IN are of relatively small amplitude and vary widely in the range between power sources Vdd and Vss.

As illustrated in FIG. 7, firstly, the circuit comprises a pair of N-channel input transistors N21, N22, the gates of which are supplied respectively with differential inputs IN and /IN. A first current source I21 is provided between the common source terminal of these transistors N21, N22 and the power source Vss. In contrast to the first embodiment, the current source I21 supplies a uniform current. Prescribed load circuits L1, L2 are provided between the drains of the input transistors N21, N22 and the power source Vdd. Load circuits such as those illustrated in FIG. 5, for example, are used for the load circuits L1, L2. The drain terminals n21, n22 of the input transistors N21, N22 are connected respectively to the gates of P-channel output transistors P25, P24. Current sources I25, I24 are connected respectively to the output transistors P25, P24, and differential outputs OUT and /OUT are output at the junction points therebetween.

Up to this point, the composition is similar to the conventional circuit illustrated in FIG. 2. The second embodiment of the invention further comprises a pair of P-channel input transistors P21, P22, the gates of which are So supplied respectively with differential inputs IN and /IN. The common sources of these input transistors P21, P22 are connected via a current source I22 to a power source Vdd. The drains of the input transistors P21, P22 are connected respectively to differential output terminals /OUT and OUT. In other words, this embodiment differs in composition from the conventional differential amplifier circuit in FIG. 2 in that a pair of P-channel input transistors P21, P22 are added.

Figure 10A:
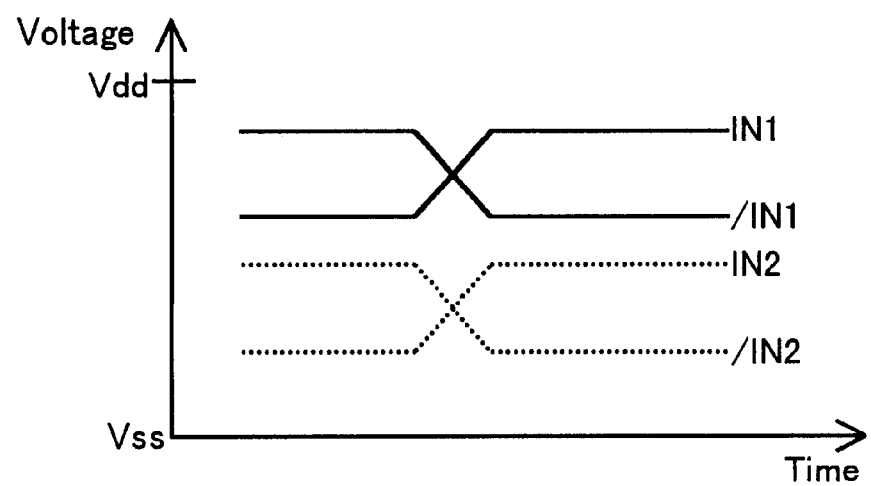
FIG. 10 is a diagram for describing a second and a third embodiment.

Here, reference is made to FIG. 10 in order to describe the operation of this differential amplifier circuit. FIG. 10 is a diagram for explaining a second and a third embodiment. FIG. 10A shows an example of differential input signals of very low amplitude. As illustrated in the diagram, in cases where, for instance, differential input signals are supplied from a power system that is different to the semiconductor device comprising the differential amplifier circuit in FIG. 7, then in the range of power sources Vss and Vdd in the differential amplifier circuit, differential input signals IN1, /IN1 as illustrated by the solid lines in FIG. 10A, and differential input signals IN2, /IN2 having a different voltage level thereto, as illustrated by the broken lines, may arise. If the amplitude of the differential input signals is of the order of 100 mV, for example, and the voltage between the power sources Vdd, Vss is relatively small, such as 5 V or 3 V, then the power supply may vary by 1 V or so between the differing power source systems.

As shown in FIG. 10A, the differential amplifier circuit illustrated in FIG. 7 performs differential amplification correctly, both in cases where the differential input signals are represented by the solid lines, and in cases where they are represented by the broken lines. In other words, if the differential input signals have a relatively high level, such as solid lines IN1, /IN1, then either one of the N-channel input transistors N21, N22 in the differential amplifier circuit switch on and a correct differential amplification operation is performed. This is because, when the differential input signals have a relatively high level, a voltage higher than the corresponding transistor threshold voltage is applied between the gates and sources of the input transistors N21, N22. On the other hand, if the differential input signals have a relatively low level, such as the broken lines IN2, /IN2, then either one of the P-channel input transistors P21, P22 switch on and a correct differential amplification operation is performed. This is because, when the differential input signals have a relatively low level, a voltage higher than the corresponding transistor threshold voltage is applied between the gates and sources of the input transistors P21, P22.

In this way, even if the central value of the amplitudes of the differential input signals is relatively high, or even if it is relatively low, either one of the input transistor pairs N21, N22 or P21, P22 will operate correctly, and hence both of the differential input signals can be received.

The current sources I21, I22, I24, I25 in the differential amplifier circuit in FIG. 7 create a circuit supplying a current which is as uniform as possible. This example of a current source circuit is described later.

Figure 8:
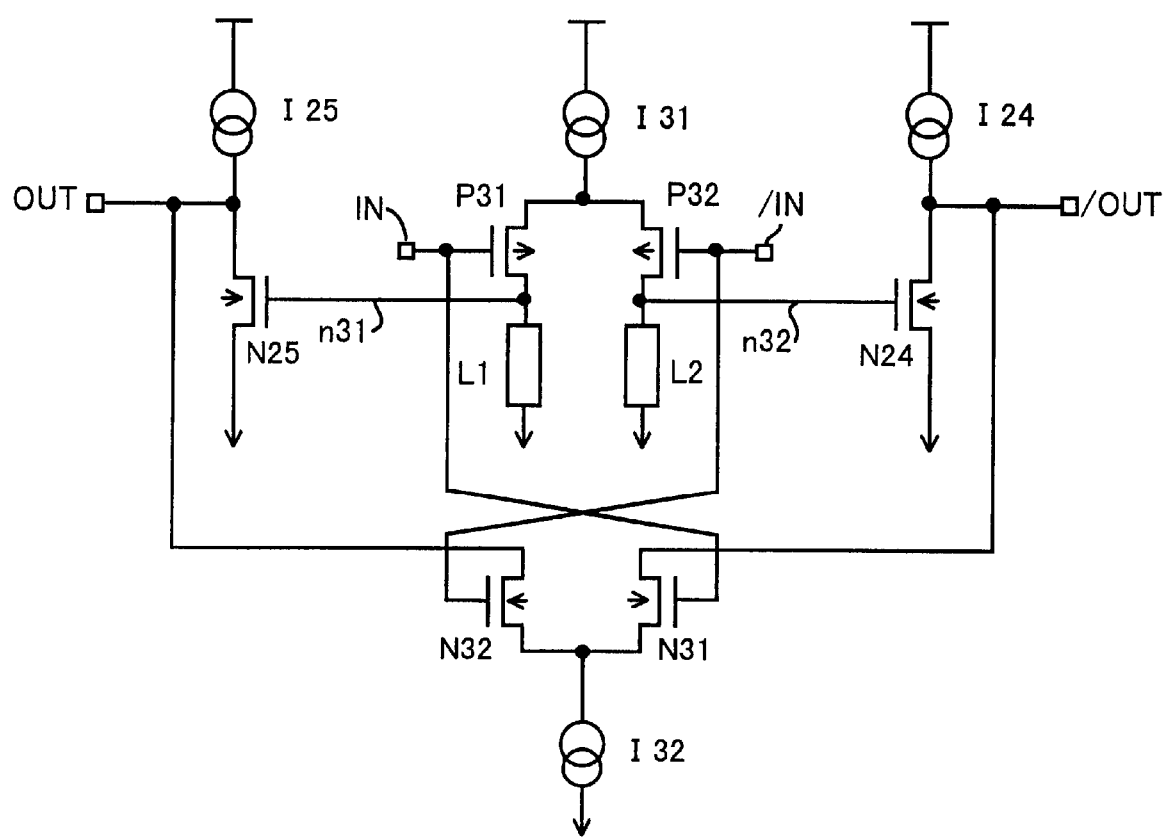
FIG. 8 is a diagram illustrating a further example of a differential amplifier circuit according to a second embodiment.

FIG. 8 is a diagram illustrating a further example of the second embodiment. In this example, the conductor types of the transistors in the differential amplifier circuit in FIG. 7 are reversed. Accordingly, the same reference numerals have been used for corresponding parts.

In the example in FIG. 8, the drains n31, n32 of a pair of P-channel input transistors P31, P32, the gates of which are supplied respectively with differential inputs IN, /IN, are connected to the gates of N-channel output transistors N25, N24. Differential outputs OUT, /OUT are output at the junction points between the output transistors N25, N24 and their current sources I25, I24. In addition to this pair of P-channel input transistors P31, p32, a pair of N-channel input transistors N31, N32 are also provided. The drains of this pair of input transistors N31, N32 are connected respectively to differential output terminals /OUT, OUT. Current sources I31, I32 are provided respectively between the sources and power supplies of these input transistors.

In the case of this example also, if the differential input signals IN, /IN are amplified at a relatively high level between the power sources, the N-channel input transistor pair N31, N32 perform the differential amplification operation. If, on the other hand, the differential input signals IN, /IN are amplified at a relatively low level between the power sources, then the P-channel input transistor pair P31, P32 perform the differential amplification operation. Therefore, it is possible to receive differential inputs of very small amplitude over a wide range.

Third Embodiment

Figure 9:
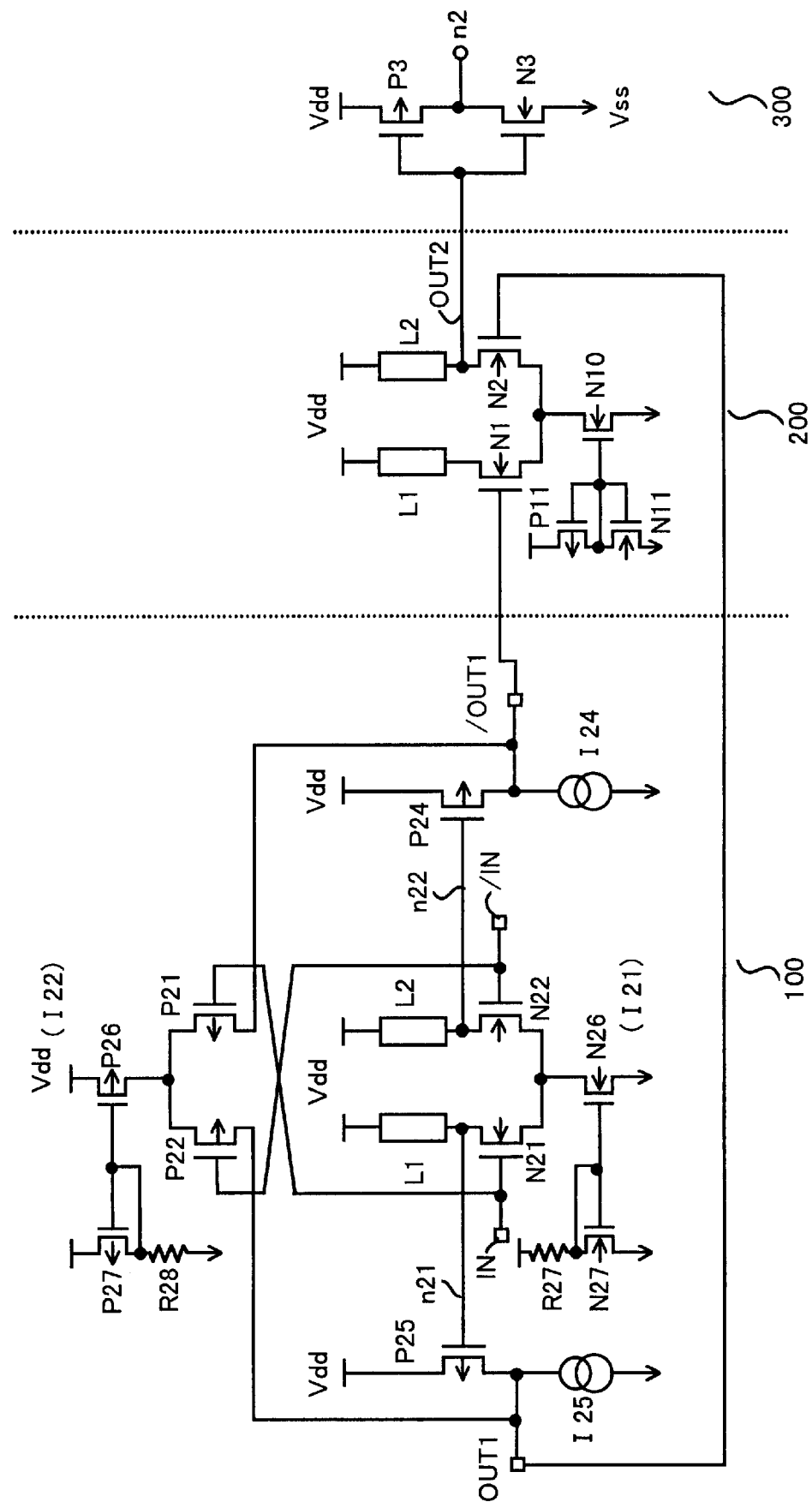
FIG. 9 is a diagram illustrating a differential amplifier circuit according to a third embodiment.

FIG. 9 is a diagram showing a differential input circuit according to a third embodiment. This differential input circuit comprises a first differential amplifier circuit 100 which receives external differential input signals IN, /IN directly, and a second differential amplifier circuit 200 which receives the differential outputs OUT1, /OUT1 of the first differential amplifier circuit 100 as differential inputs. The output OUT2 of the second differential amplifier circuit 200 is supplied to a subsequent CMOS inverter comprising transistors P3 and N3. As a result, a signal n2 performing a full swing between power sources Vdd, Vss is generated.

The aforementioned first differential amplifier circuit 100 is the differential amplifier circuit according to the second embodiment illustrated in FIG. 7. The second differential amplifier circuit 200 is the differential amplifier circuit according to the first embodiment illustrated in FIG. 4. The second differential amplifier circuit 200 may also be the circuit illustrated in FIG. 5.

The first differential amplifier circuit 100 uses a circuit comprising N-channel transistors N26, N27 and external resistance R27 as a current source I21. The gates of the transistors N26, N27 are connected to the drain of transistor N27, thereby constituting a current mirror circuit. Since the resistance R27 is an external resistance which is not affected by manufacturing variations in the semiconductor device, the current flowing in the transistors N27, N28 of this current mirror circuit has a uniform value which is not affected by manufacturing variations. Current source I22 similarly employs a circuit comprising P-channel transistors P26, P27 and an external resistance R28. In this case also, a uniform current which is not affected by manufacturing variations is supplied to the P-channel input transistors P21, P22.

Figure 10B:
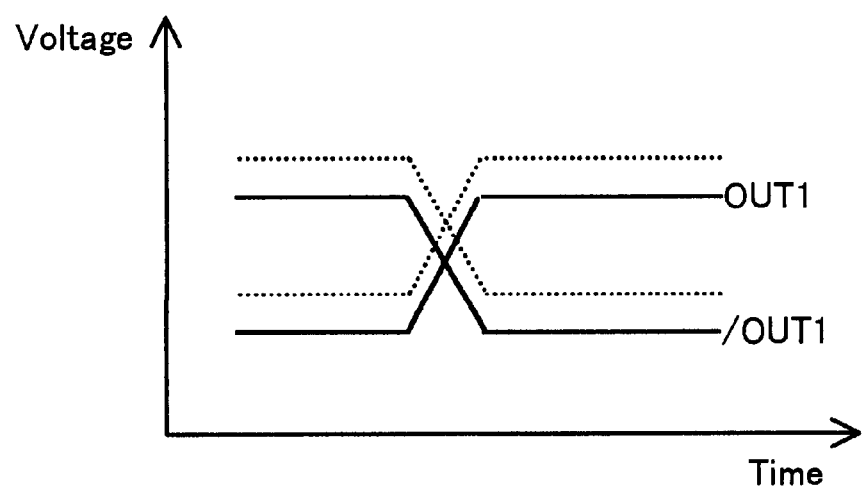

As illustrated in FIG. 10A, even if the central value of the amplitudes of differential inputs IN, /IN of very small amplitude varies between the power sources, either one of the input transistor pairs N21, N22 or P21, P22 in the first differential amplifier circuit 100 will operate, thereby performing a correct differential amplification function. However, the current sources I21, I22 of the first differential amplifier circuit 100 supplies a uniform current which does not change in response to manufacturing variations. Therefore, since the impedance of the input transistors varies with manufacturing discrepancies, there will be some variation in the central value of the amplitudes of the differential outputs OUT1, /OUT1 generated, as shown in FIG. 10B. However, such central value does not fall such that the input transistors N1, N2 of the subsequent second differential amplifier circuit 200 assume a non-conducting state. Consequently, the second differential amplifier circuit 200 will be able to perform correct differential amplification with respect to the differential output signals OUT1, /OUT1.

Furthermore, as described in the first embodiment, the current value of the current source circuit in the second differential amplifier circuit 200 varies according to manufacturing discrepancies. Therefore, the central value of the amplitudes of output OUT2 of the second differential amplifier circuit 200 maintains a virtually uniform level which is not affected by manufacturing discrepancies. Accordingly, the relationship between the threshold voltage of the subsequent CMOS inverter and the output OUT2 is constant, and there is no occurrence of through current flowing to the CMOS inverter, or differing propagation delay times at the rise and fall of the inputs.

Figure 1:
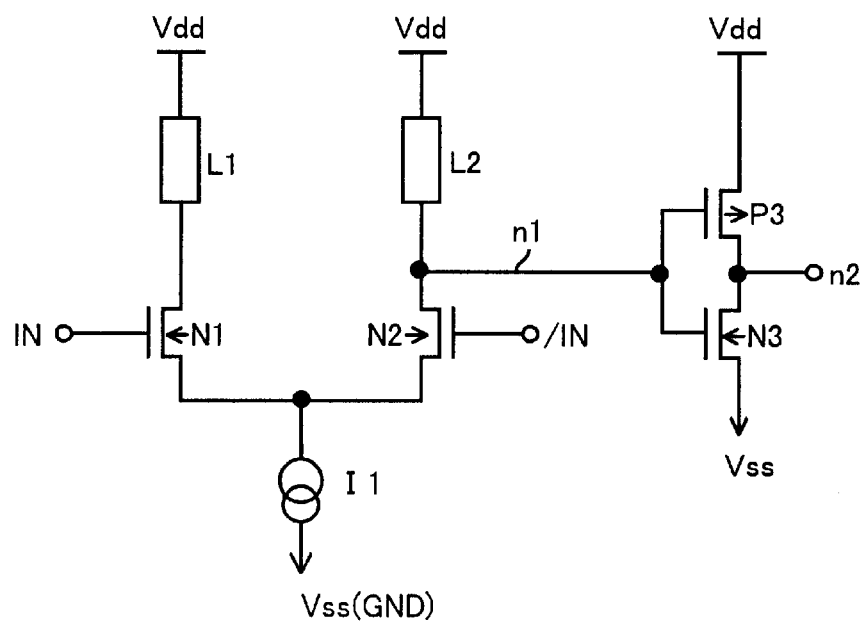
FIG. 1 is a diagram showing an example of a conventional differential amplifier circuit.

As described above, in cases where differential input signals of small amplitude are received from an external source, it is desirable to combine a differential amplifier circuit according to the second embodiment and a differential amplifier circuit according to the first embodiment, as illustrated in FIG. 9. Of course, it is also possible to combine the two of the differential amplifier circuits shown in FIG. 6 and FIG. 8. Moreover, since small-amplitude differential input signals are received from an external source, it is also possible simply to combine the differential amplifier circuit according to the second embodiment with a standard differential amplifier circuit as illustrated in FIG. 1, 2, or the like.

According to the present invention, it is possible to provide a differential amplifier circuit whereby output signals of a uniform level are generated without receiving the effects of manufacturing variations. Furthermore, according to the present invention, it is possible to provide a differential amplifier circuit which performs differential amplification correctly when receiving differential input signals of small amplitude which have a large variation in the central voltage of the signal amplitudes.

Second aspect of the invention Pull up-type differential driver

Below, first to fifth embodiments of a pull up-type differential driver according to a second aspect of the present invention are described, together with embodiments of a differential driving method according to the present invention, with reference to FIG. 11–FIG. 15.

First Embodiment
FIG. 11

FIG. 11 is a circuit diagram showing the principal part of one example of a signal transmission system comprising a first embodiment of a pull up-type differential bus driver according to the present invention. In FIG. 11, 20 is a semiconductor device forming a driver, 21 is a semiconductor device forming a receiver, 22 and 23 are signal lines connecting semiconductor devices 20 and 21, 24 and 25 are terminal resistances, 26 is a terminal voltage line supplying a terminal voltage VT1, and 27 is a terminal voltage line supplying a terminal voltage VT2.

In the semiconductor device 20, 28 is a first embodiment of a pull up-type differential bus driver according to the present invention, SIN, ISIN are differential input signals input from an internal circuit (not illustrated) to the first embodiment 28 of a pull up-type differential bus driver according to the present invention, and 29 and 30 are signal output terminals to which differential output signals SOUT, /SOUT are output from the pull up-type differential bus driver 28 according to the first embodiment of the present invention.

In the pull up-type differential bus driver 28 according to the first embodiment of the present invention, 31 is a power source line supplying power voltage V1, 32 is a fixed current source, 33 is an N-channel MOS transistor (hereinafter, called NMOS transistor) forming first switching means, to which input signal SIN is input, and 34 is an NMOS transistor forming second switching means, the switching on and off of which is controlled according to the input signal /SIN.

Here, the upstream terminal 32A of the constant current source 32 is connected to the power line 31, the drain of the NMOS transistor 33 is connected the downstream terminal 32B of the constant current source 32 and the source thereof is connected to signal output terminal 29, whilst the drain of NMOS transistor 34 is connected to the downstream terminal 32B of the constant current source 32 and the source thereof is connected to signal output terminal 30.

Moreover, in the constant current source 32, 35 is a P-channel MOS transistor for generating a constant current (hereinafter, called a PMOS transistor), 36 is a bias circuit for generating a bias voltage to be supplied to the gate of PMOS transistor 35 in order to generate a constant current, 37 is a control circuit forming a third control circuit, and 38 is a control circuit forming a fourth control circuit.

Here, when the voltage in signal line 22 or the voltage in signal line 23 is lower than the power voltage V1, the control circuit 37 supplies a bias voltage to PMOS transistor 35, and when the voltage in signal line 22 or the voltage in signal line 23 is higher than power voltage V1, it supplies the higher voltage out of the voltage in signal line 22 and the voltage in signal line 23 to the gate of the PMOS transistor 35.

In control circuit 37, 39 is a power line supplying power voltage V1, 40 is an NMOS transistor, the drain of which is connected to the bias voltage output terminal of the bias circuit 36, the gate of which is connected to the power line 39, and the source of which is connected to the gate of PMOS transistor 35.

As described hereinafter, NMOS transistor 40 serves to prevent influx of current to the bias circuit 36, in cases where the voltage in signal line 22 or the voltage in signal line 23 is supplied to the gate of PMOS transistor 35 and the PMOS transistor is switched off. 41 is a power line supplying power voltage V1, 42, 43 are PMOS transistors, 44 is a control circuit forming a fifth control circuit, and 45 is a control circuit forming a sixth control circuit.

The PMOS transistor 42 serves to switch off the PMOS transistor 35, when the voltage in signal line 22 is higher than the power voltage V1, by supplying the voltage in signal line 22 to the gate of the PMOS transistor 35, and the source of PMOS transistor 42 is connected to the gate of PMOS transistor 35, the gate thereof is connected to power line 41 and the drain thereof is connected to signal output terminal 29.

Furthermore, PMOS transistor 43 serves to switch off PMOS transistor 35 when the voltage in supply line 23 is higher than the power voltage V1, by supplying the voltage in signal line 23 to the gate of the PMOS transistor 35, and the source of PMOS transistor 43 is connected to the gate of PMOS transistor 35, the gate thereof is connected to power line 41 and the drain thereof is connected to signal output terminal 30.

When the signal line 22 is lower than power voltage V1, control circuit 44 supplies power voltage V1 to a well for PMOS transistor 42, wherein a channel region is fabricated forming a back gate of the transistor, and when the signal line 22 is higher than power voltage V1, it supplies the voltage in signal line 22 to the well of the PMOS transistor 42, thereby maintaining an inverse bias state between the drain and well of the PMOS transistor 42.

Here, "well" indicates a well region consisting of an N-type semiconductor region for the PMOS transistor. Therefore, P-type source and drain regions are formed inside this well region. The well region forms a channel region for the transistor and becomes a back gate of the MOS transistor.

In the control circuit 44, 46 and 47 are power lines supplying a power voltage V1, and 48, 49 are PMOS transistors: the source of PMOS transistor 48 is connected to the power line 46, the gate thereof is connected to the signal output terminal 29 and the drain and well thereof are connected to the well of PMOS transistor 42, whereas the source and well of PMOS transistor 49 are connected to the well of PMOS transistor 42, the gate thereof is connected to power line 47 and the drain thereof is connected to signal output terminal 29.

Control circuit 45 supplies power voltage V1 to the well of the PMOS transistor 43, when the signal line 23 is lower than power voltage V1, and it supplies the voltage in signal line 23 to the well of the PMOS transistor 43, when the signal line 23 is higher than power voltage V1, thereby maintaining an inverse bias state between the drain and well of the PMOS transistor 43.

In the control circuit 45, 50 and 51 are power lines supplying power voltage V1, and 52 and 53 are PMOS transistors; the source of PMOS transistor 52 is connected to power line 50, the gate thereof is connected to signal output terminal 30, and the drain and well thereof are connected to the well of PMOS transistor 43, whilst the source and well of PMOS transistor 53 are connected to the well of PMOS transistor 43, the gate thereof is connected to power line 51 and the drain thereof is connected to signal output terminal 30.

When the voltage at the drain of PMOS transistor 35 is lower than the power voltage V1, the control circuit 38 supplies power voltage V1 to the well of the PMOS transistor 35, and when the voltage at the drain of PMOS transistor 35 is higher than the power voltage V1, it supplies the voltage at the drain of PMOS transistor 35 to the well of PMOS transistor 35, thereby maintaining an inverse bias state between the drain and well of the PMOS transistor 35.

In the control circuit 38, 54 and 55 are power lines supplying power voltage V1, and 56 and 77 are PMOS transistors; the source of PMOS transistor 56 is connected to the power line 54, the gate thereof is connected to the drain of PMOS transistor 35, and the drain and well thereof are connected to the well of PMOS transistor 35, whilst the source and well of PMOS transistor 57 are connected to the well of PMOS transistor 35, the gate thereof is connected to power line 55, and the drain thereof is connected to the drain of PMOS transistor 35.

In the signal transmission system constituted in this way, when the voltage in signal 22 and the voltage in signal line 23 are lower than the power voltage V1, in control circuit 37, PMOS transistor 42 turns off and PMOS transistor 43 turns off, the bias voltage output from bias circuit 36 is supplied via NMOS transistor 40 to the gate of PMOS transistor 35, and a fixed current is generated by PMOS transistor 35.

Furthermore, in this case, PMOS transistor 48 is turned on and PMOS transistor 49 is turned off in control circuit 44, and power voltage V1 is supplied to the well of PMOS transistor 42, thereby maintaining an inverse bias state between the drain and well of PMOS transistor 42.

In control circuit 45, PMOS transistor 52 is turned on and PMOS transistor 53 is turned off, and power voltage V1 is supplied to the well of PMOS transistor 43, thereby maintaining an inverse bias state between the drain and well of PMOS transistor 43.

In control circuit 38, PMOS transistor 56 is turned on and PMOS transistor 57 is turned off, and a power voltage V1 is supplied to the well of PMOS transistor 35, thereby maintaining an inverse bias state between the drain and well of PMOS transistor 35.

Here, when the NMOS transistor 33 is on, if, for any reason, the power voltage V1 falls, or the terminal voltages VT1, VT2 rise so that the voltage in signal line 22 becomes higher than the power voltage V1, then in control circuit 37, PMOS transistor 42 will turn on and the voltage in signal line 22 will be supplied to the gate of PMOS transistor 35, whilst the PMOS transistor 35 will turn off and the NMOS transistor 40 will also turn off, thereby preventing influx of current to the bias circuit 36.

In control circuit 44, PMOS transistor 48 is turned off and PMOS transistor 49 is turned on, and the voltage in signal line 22 is supplied to the well of PMOS transistor 42, thereby maintaining an inverse bias state between the drain and well of PMOS transistor 42.

Moreover, in control circuit 38, PMOS transistor 56 is turned off and PMOS transistor 57 is turned on, and the voltage in signal line 22 is supplied to the well of PMOS transistor 35, thereby maintaining an inverse bias state between the drain and well of PMOS transistor 35.

When NMOS transistor 34 is on, if, for any reason mentioned above, the voltage of the signal line 23 becomes higher than the power voltage V1, then in control circuit 37, PMOS transistor 43 will turn on and the voltage in signal line 23 will be supplied to the gate of PMOS transistor 35, whilst PMOS transistor 35 will turn off and NMOS transistor 40 will also turn off, thereby preventing influx of current to the bias circuit 36.

In control circuit 45, PMOS transistor 52 is turned off and PMOS transistor 53 is turned on, and the voltage in signal line 23 is supplied to the well of PMOS transistor 43, thereby maintaining an inverse bias state between the drain and well of the PMOS transistor 43.

In control circuit 38, PMOS transistor 56 is turned off and PMOS transistor 57 is turned on, and the voltage in signal line 22 is supplied to the well of PMOS transistor 35, thereby maintaining an inverse bias state between the drain and well of PMOS transistor 35. In this case, the gate, drain (source during operation), and well (back gate) of the PMOS transistor 35 all assume the potential of signal line 22 and the PMOS transistor 35 can be switched off completely.

Therefore, according to the first embodiment 28 of a pull up-type differential bus driver according to the present invention, even if, for any reason, the voltage of either or both signal line 22 and/or signal line 23 has risen above the power voltage V1, it is possible to prevent influx of current from either or both signal line 22 and/or signal line 23 into the power line 31, and therefore malfunction of the semiconductor device 20 due to influx of current from either or both signal line 22 and/or signal line 23 into the power line 31 side can be prevented and the reliability of the semiconductor device 20 can be improved. Here, malfunction of the semiconductor device 20 relates to cases where there is influx of current into the power line 31, whereby elements linked thereto are destroyed and the potential of power voltage V1 changes.

Second Embodiment

FIG. 12

Figure 12:
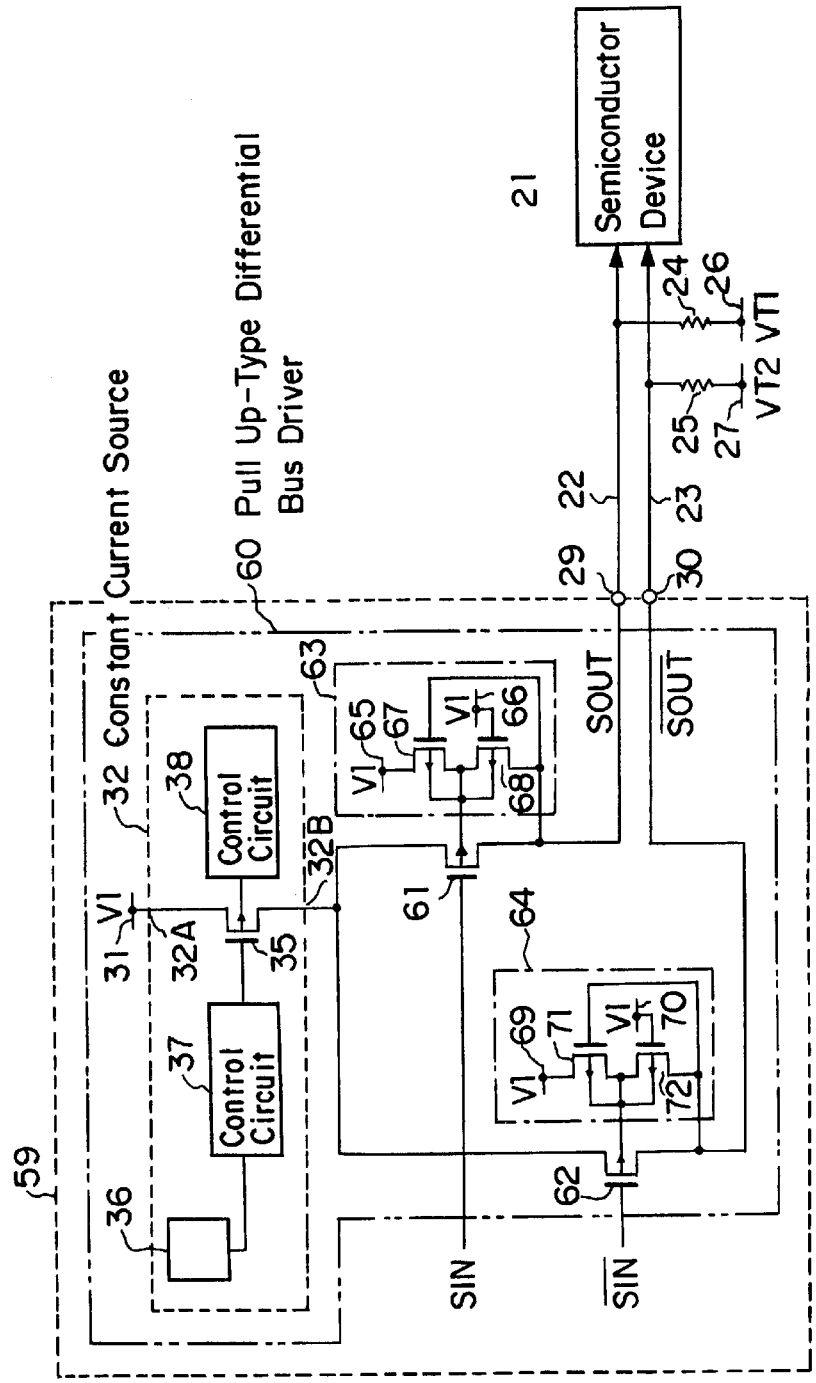
FIG. 12 is a circuit diagram showing the principal part of one example of a signal transmission system comprising a second embodiment of a pull up-type differential bus driver according to the present invention.

FIG. 12 is a circuit diagram showing the principal part of one example of a signal transmission system comprising a second embodiment of a pull up-type differential bus driver according to the present invention. The signal transmission system in FIG. 12 uses a semiconductor device 59 having a different circuit composition to the semiconductor device 20 shown in FIG. 1, apart from which it is constituted similarly to the signal transmission system in FIG. 11.

Semiconductor device 59 is provided with a second embodiment 60 of a pull up-type differential bus driver according to the present invention, in place of the first embodiment 28 of a pull up-type differential bus driver according to the present invention illustrated in FIG. 11, apart from which it is constituted similarly to the semiconductor device 20 in FIG. 11.

The second embodiment 60 of the pull up-type differential bus driver according to the present invention uses PMOS transistors 61, 62 as first and second switching means, in place of the NMOS transistors 33, 34 shown in FIG. 11, and moreover, it comprises control circuits 63, 64 forming first and second control circuits for controlling the voltage in the wells of PMOS transistors 61, 62, apart from which it is constituted similarly to the first embodiment 28 of a pull up-type differential bus driver according to the present invention illustrated in FIG. 11.

When the voltage in signal line 22 is lower than the power voltage V1, control circuit 63 supplies power voltage V1 to the well of PMOS transistor 61, and when the voltage in signal line 22 is higher than the power voltage V1, it supplies the voltage in signal line 22 to the well of the PMOS transistor 61, thereby maintaining an inverse bias state between the drain and well of the PMOS transistor 61.

In the control circuit 63, 65 and 66 are power lines supplying power voltage V1, and 67 and 68 are PMOS transistors; the source of PMOS transistor 67 is connected to power line 65, the gate thereof is connected to signal output terminal 29, and the drain and well thereof are connected to the well of PMOS transistor 61, whilst the source and well of PMOS transistor 68 are connected to the well of PMOS transistor 61, the gate thereof is connected to power line 66 and the drain thereof is connected to the signal output terminal 29.

Moreover, when the voltage in signal line 23 is lower than the power voltage V1, the control circuit 64 supplies power voltage V1 to the well of the PMOS transistor 62, and when the voltage in signal line 23 is higher than the power voltage V1, it supplies the voltage in signal line 23 to the well of PMOS transistor 62, thereby maintaining an inverse bias state between the drain and well of the PMOS transistor 62.

In control circuit 64, 69 and 70 are power lines supplying power voltage V1, and 71 and 72 are PMOS transistors; the source of PMOS transistor is connected to power line 69, the gate thereof is connected to signal output terminal 30, and the drain and well thereof are connected to the well of PMOS transistor 62, whilst the source and well of PMOS transistor 72 are connected to the well of PMOS transistor 62, the gate thereof is connected to power line 70, and the drain thereof is connected to signal output terminal 30.

In a signal transmission system constituted in this way, if the voltage in signal line 22 or the voltage in signal line 23 is lower than power voltage V1, then in the control circuit 63, PMOS transistor 67 is turned on and PMOS transistor 68 is turned off, and the power voltage V1 is supplied to the well of PMOS transistor 61, thereby maintaining an inverse bias state between the drain and well of the PMOS transistor 61.

Furthermore, in the control circuit 64, the PMOS transistor 71 is turned on and the PMOS transistor 72 is turned off, and power voltage V1 is supplied to the well of the PMOS transistor 62, thereby maintaining an inverse bias state between the drain and well of the PMOS transistor 62.

Here, when the PMOS transistor 61 is on, if, for any reason as described above, the voltage in signal line 22 has become higher than the power voltage V1, then in the control circuit 63, PMOS transistor 67 will turn off and PMOS transistor 68 will turn on, and the voltage in signal line 22 will be supplied to the well of PMOS transistor 61, thereby maintaining an inverse bias state between the drain and well of the PMOS transistor 61.

Moreover, when the PMOS transistor 62 is on, if, for any reason as described above, the voltage in signal line 23 has become higher than the power voltage V1, then in the control circuit 64, PMOS transistor 71 will turn off and PMOS transistor 72 will turn on, and the voltage in signal line 23 will be supplied to the well of PMOS transistor 62, thereby maintaining an inverse bias state between the drain and well of the PMOS transistor 62.

Therefore, according to the second embodiment 60 of a pull up-type differential bus driver according to the present invention, it is possible to prevent influx of current from either one or both of signal line 22 and signal line 23 to the power line 31 side, even if, for any reason, the voltage in either or both signal line 22 and/or signal line 23 has risen above the power voltage V1, since PMOS transistor 35 will be in an off state, similarly to the first embodiment, and therefore malfunction of the semiconductor device 59 due to influx of current from either or both signal line 22 and/or signal line 23 to the power line 31 side can be avoided and the reliability of the semiconductor device 59 can be raised.

Third Embodiment

FIG. 13

Figure 13:
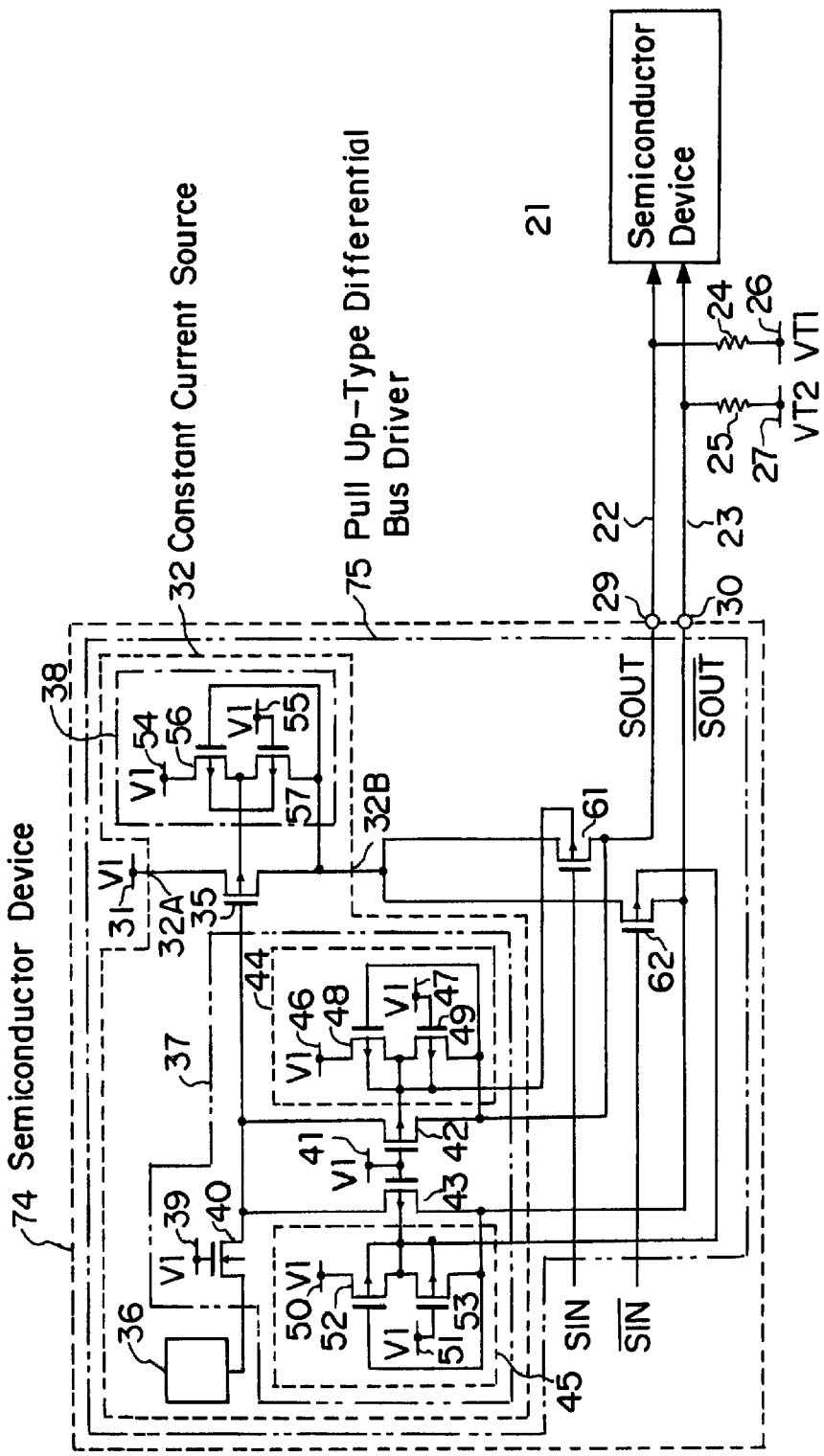
FIG. 13 is a circuit diagram showing the principal part of one example of a signal transmission system comprising a third embodiment of a pull up-type differential bus driver according to the present invention.

FIG. 13 is a circuit diagram showing the principal part of one example of a signal transmission system comprising a third embodiment of a pull up-type differential bus driver according to the present invention. The signal transmission system shown in FIG. 13 uses a semiconductor device 74 having a different circuit composition to the semiconductor device 59 shown in FIG. 12, apart from which it is constituted similarly to the signal transmission system in FIG. 12.

Semiconductor device 74 comprises a third embodiment of a pull up-type differential bus driver according to the present invention, in place of the second embodiment 60 of a pull up-type differential bus driver according to the present invention as illustrated in FIG. 12. Apart from this, it is constituted similarly to the semiconductor device 59 shown in FIG. 12.

In the third embodiment 75 of the pull up-type differential bus driver according to the present invention, the wells of PMOS transistors 42, 61 and the wells of PMOS transistors 43, 62 are mutually connected, respectively, and the control circuits 63, 64 illustrated in FIG. 12 are integrated with control circuits 44, 45, apart from which it is constituted similarly to the second embodiment of a pull up-type differential bus driver according to the present invention shown in FIG. 12.

In a third embodiment 75 of a pull up-type differential bus driver according to the present invention constituted in this way, an inverse bias state is maintained between the drain and well of the PMOS transistor 61 by the control circuit 44, and an inverse bias state is maintained between the drain and well of the PMOS transistor 62 by the control circuit 45.

Therefore, according to the third embodiment 75 of the differential bus driver according to the present invention, it is possible to prevent influx of current from one or both of signal 22 and/or signal line 23 into the power line 31, if, for any reason, the voltage of one or both of signal line 22 and/or signal line 23 has become higher than the power voltage V1, and therefore malfunction of the semiconductor device 74 due to influx of current from one or both of the signal line 22 and/or signal line 23 to the power line 31 side can be avoided and the reliability of the semiconductor device 74 can be improved.

Furthermore, in addition to connecting mutually the wells of PMOS transistors 42, 61 and the wells of PMOS transistors 43, 62, respectively, it is also possible to provide control circuits 63, 64 shown in FIG. 13 in place of control circuits 44, 45.

Figure 14:
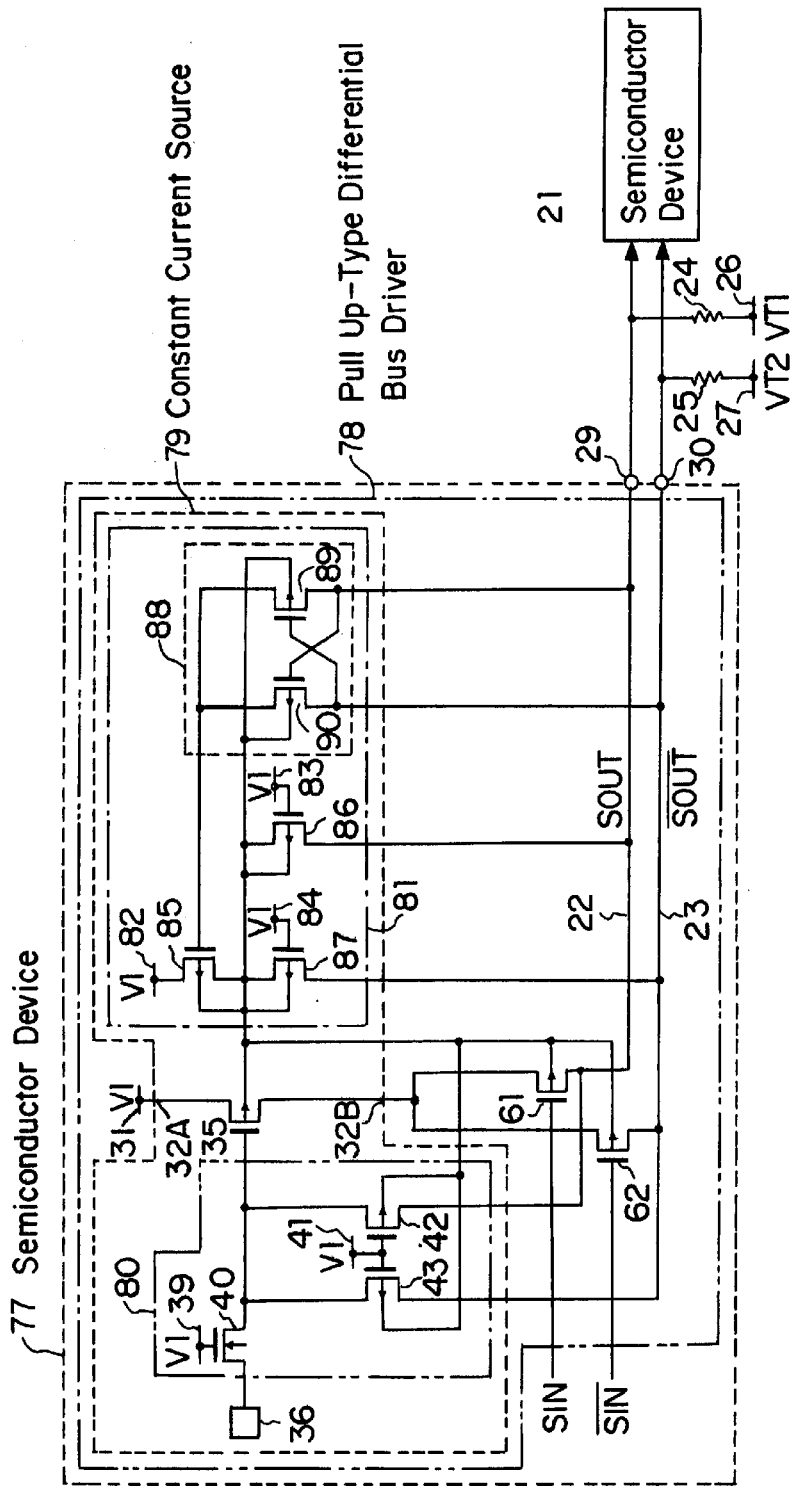
FIG. 14 is a circuit diagram showing the principal part of one example of a signal transmission system comprising a fourth embodiment of a pull up-type differential bus driver according to the present invention.

Fourth Embodiment
FIG. 14

FIG. 14 is a circuit diagram showing the principal part of one example of a signal transmission system comprising a fourth embodiment of a pull up-type differential bus driver according to the present invention. The signal transmission system shown in FIG. 14 uses a semiconductor device 77 having a different circuit composition to the semiconductor device 74 shown in FIG. 13, apart from which it is constituted similarly to the signal transmission system in FIG. 13.

In semiconductor device 77, a fourth embodiment 78 of a pull up-type differential bus driver according to the present invention is installed in place of the third embodiment 75 of a pull up-type differential bus driver according to the present invention shown in FIG. 13, apart from which it is constituted similarly to the semiconductor device 74 illustrated in FIG. 13.

In the fourth embodiment 78 of the pull up-type differential bus driver according to the present invention, a constant current source 79 having a different circuit composition from the constant current source 32 in FIG. 13 is installed, and furthermore, the wells of PMOS transistors 35, 42, 43, 61, 62 are mutually connected, apart from which it is constituted similarly to the third embodiment 75 of a pull up-type differential bus driver according to the present invention shown in FIG. 13.

In the fixed current source 79, control circuit 80 is provided as a third control circuit and control circuit 81 is provided as a fourth circuit, apart from which it is constituted similarly to the constant current source 32 shown in FIG. 13.

In the control circuit 80, control circuits 44, 45 contained in the control circuit 37 illustrated in FIG. 13 are not provided, but are combined commonly with the control circuit 81, apart from which control circuit 80 is constituted similarly to the control circuit 37 in FIG. 13.

When the voltage in signal line 22 and the voltage in signal line 23 is lower than the power voltage V1, the control circuit 81 supplies power voltage V1 to the well of the PMOS transistor 35, and when the voltage in signal line 22 or the voltage in signal line 23 is higher than the power voltage V1, it supplies the higher voltage of the voltage in signal line 22 and the voltage in signal line 23 to the well of PMOS transistor 35, thereby maintaining an inverse bias state between the drain and well of PMOS transistor 35.

In control circuit 81, 82–84 are power lines supplying power voltage V1, 85–87 are PMOS transistors, 88 is a control circuit forming a seventh control circuit, and 89, 90 are PMOS transistors.

Here, the source of PMOS transistor 85 is connected to power line 82, and the drain and well thereof are connected to the well of PMOS transistor 35. The source and well of PMOS transistor 86 are connected to the well of PMOS transistor 35, the gate thereof is connected to power line 83, and the drain thereof is connected to signal output terminal 29. The source and well of PMOS transistor 87 are connected to the well of PMOS transistor 35, the gate thereof is connected to power line 84, and the drain thereof is connected to the signal output terminal 30.

Furthermore, the source of PMOS transistor 89 is connected to the gate of PMOS transistor 85, the gate thereof is connected to signal output terminal 30, the drain thereof is connected to signal output terminal 29, and the well thereof is connected to the well of PMOS transistor 35. The source of PMOS transistor 90 is connected to the gate of PMOS transistor 85, the gate thereof is connected to signal output terminal 29, the drain thereof is connected to signal output terminal 30, and the well thereof is connected to the well of PMOS transistor 35.

In a signal transmission system constituted in this way, when the voltage in signal line 22 or the voltage in signal line 23 is lower than the power voltage V1, PMOS transistor 86 is switched off and PMOS transistor 87 is switched off.

Moreover, in this case, if the voltage in signal line 22 is lower than the voltage in signal line 23, then PMOS transistor 89 switches off and PMOS transistor 90 switches on, whereby the voltage in signal line 23 is supplied to the gate of PMOS transistor 85 and PMOS transistor 85 switches on.

If, on the other hand, the voltage in signal line 23 is lower than the voltage in signal line 22, then PMOS transistor 89 switches on and PMOS transistor 90 switches off, whereby the voltage in signal line 22 is supplied to the gate of PMOS transistor 85 and PMOS transistor 85 switches on.

Consequently, when the voltage in signal line 22 or the voltage in signal line 23 is lower than the power voltage V1, power voltage V1 is supplied to the wells of PMOS transistors 35, 42, 43, 61, 62, thereby maintaining an inverse bias state between the drains and sources of PMOS transistors 35, 42, 43, 61, 62.

Furthermore, when the PMOS transistor 61 is on, if, for any reason, the voltage in signal line 22 has risen above the power voltage V1, then in the control circuit 80, PMOS transistor 42 will switch on and the voltage in signal line 22 will be supplied to the gate of PMOS transistor 35, thereby switching the PMOS transistor 35 off.

In control circuit 81, PMOS transistor 89 switches on and the voltage in signal line 22 is supplied to the gate of PMOS transistor 85, whereby PMOS transistor 85 switches off and PMOS transistor 86 switches on.

Consequently, the voltage in signal line 22 is supplied to the wells of PMOS transistors 35, 42, 43, 61, 62, thereby maintaining an inverse bias state between the drains and sources of PMOS transistors 35, 42, 43, 61, 62.

Therefore, according to the fourth embodiment 78 of the pull up-type differential bus driver according to the present invention, it is possible to prevent influx of current from signal line 22 or signal line 23 into the power line 31 side, even if, for any reason, the voltage in signal line 22 or the voltage in signal line 23 has become higher than the power voltage V1, and hence malfunction of the semiconductor device 77 due to influx of current from signal line 22 or signal line 23 into the power line 31 can be prevented and the reliability of the semiconductor device 77 can be improved.

Fifth Embodiment

FIG. 15

Figure 15:
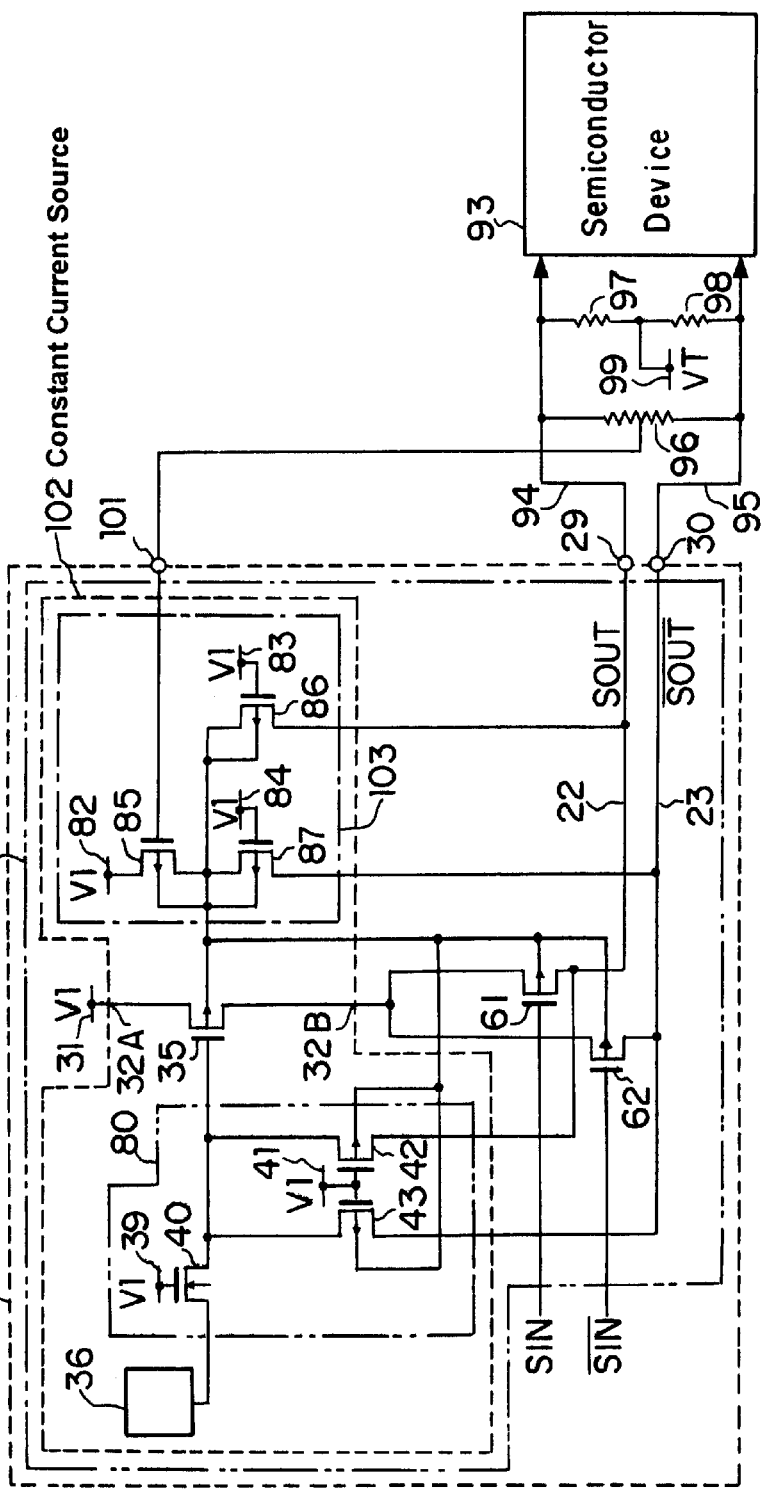
FIG. 15 is a circuit diagram showing the principal part of one example of a signal transmission system comprising a fifth embodiment of a pull up-type differential bus driver according to the present invention.
Figure 16:
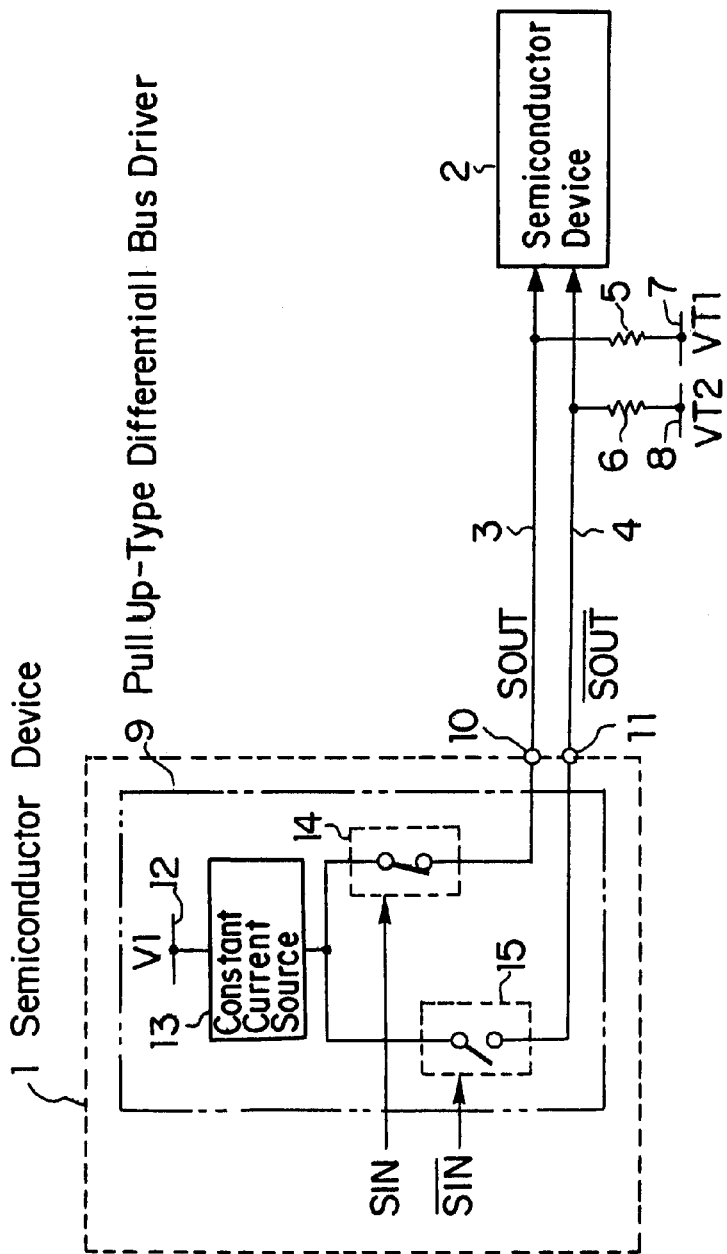
FIG. 16 is a circuit diagram showing the principal part of one example of a signal transmission system comprising an example of a conventional differential bus driver.

FIG. 15 is a circuit diagram showing the principal part of one example of a signal transmission system comprising a fifth embodiment of a pull up-type differential bus driver according to the present invention. In FIG. 15, 92 is a semiconductor device forming a driver, 93 is a semiconductor device forming a receiver, 94 and 95 are signal lines connecting semiconductor devices 92 and 93 together, 96 is a terminal resistance on the side of semiconductor device 92, 97 and 98 are terminal resistances on the side of semiconductor device 98, and 99 is a terminal resistance supplying a terminal voltage VT.

In semiconductor device 92, a fifth embodiment 100 of a pull up-type differential bus driver according to the present invention is installed in place of the fourth embodiment 78 of a pull up-type differential bus driver according to the present invention shown in FIG. 14, and a control terminal 101 is also provided, apart from which, semiconductor device 92 is constituted similarly to the semiconductor device 77 shown in FIG. 14. Control terminal 101 is connected to a terminal inside the terminal resistance 96.

The fifth embodiment 100 of a pull up-type differential bus driver according to the present invention comprises a fixed current source 102 having a different circuit composition to the fixed current source 79 shown in FIG. 14, apart from which it is constituted similarly to the fourth embodiment 78 of a pull up-type differential bus driver according to the present invention in FIG. 14.

The fixed current source 102 comprises a control circuit 103 as a fourth control circuit, apart from which it is constituted similarly to the control circuit 81 shown in FIG. 14, and the control circuit 103 does not comprise the control circuit 88 provided in control circuit 81 shown in FIG. 14, and furthermore, the gate of PMOS transistor 85 is connected to control terminal 101, apart from which it is constituted similarly to the control circuit 81.

In a signal transmission system constituted in this way, when the voltage in signal line 22 and the voltage in signal line 23 are lower than the power voltage V1, then PMOS transistor 86 is switched off and PMOS transistor 87 is switched off, whilst PMOS transistor 85 is switched on.

Consequently, when the voltage in signal line 22 and the voltage in signal line 23 are lower than the power voltage V1, this power voltage V1 is supplied to the wells of PMOS transistors 35, 42, 43, 61, 62, thereby maintaining an inverse bias state between the drains and wells of PMOS transistors 35, 42, 43, 61, 62.

Moreover, if, for any reason, the voltage in signal line 22 has risen above the power voltage V1, then in the control circuit 80, PMOS transistor 42 switches on and the voltage in signal line 22 is supplied to the gate of PMOS transistor 35, thereby switching PMOS transistor 35 off.

Moreover, in control circuit 103, the intermediate potential of signal lines 22, 23 is supplied from resistance 96 to the gate of PMOS transistor 85, whereby PMOS transistor 85 switches off and PMOS transistor 86 switches on.

As a result of this, the voltage in signal line 22 is supplied to the wells of PMOS transistors 35, 42, 43, 61, 62, thereby maintaining an inverse bias state between the drains and wells of PMOS transistors 35, 42, 43, 61, 62. Therefore, PMOS transistor 35 assumes an off state completely.

Moreover, if, for any reason, the voltage in signal line 23 has risen above the power voltage V1, then in control circuit 80, PMOS transistor 43 switches on and the voltage in signal line 23 is supplied to the gate of PMOS transistor 35, thereby switching PMOS transistor 35 off.

In control circuit 103, the terminal voltage VT is supplied to the gate of PMOS transistor 85, whereby PMOS transistor 85 is switched off and PMOS transistor 87 is switched on.

Consequently, the voltage in signal line 22 is supplied to the wells of PMOS transistors 35, 42, 43, 61, 62, thereby maintaining an inverse bias state between the drains and wells of PMOS transistors 35, 42, 43, 61, 62.

Therefore, according to the fifth embodiment 100 of a pull p-type differential bus driver according to the present invention, it is possible to prevent influx of current from either or both signal line 22 and/or signal line 23 into the power line 31, if, for any reason, the voltage in either or both signal line 22 and/or signal line 23 has risen above the power voltage V1, since the PMOS transistor 35 will be switched off, and hence malfunction of the semiconductor device 92 due to influx of current from either or both signal line 22 and/or signal line 23 into the power line 31 can be avoided and the reliability of the semiconductor device 92 can be increased.

In the fifth embodiment 100 of a pull up-type differential bus driver according to the present invention, the control terminal 101 was connected to a terminal inside the terminal resistance 96, but it is also possible to omit the control terminal 101 and connected the gate of PMOS transistor 85 to signal output terminal 29 or signal output terminal 30.

As described above, according to the pull up-type differential bus driver of the present invention, by providing in the fixed current source a control circuit implementing control such that there is no influx of current from either or both the first signal line and/or the second signal line into the power line side, in cases where either or both the voltage in the first signal line and/or the voltage in the second signal line has become higher than the power voltage, it is possible to prevent influx of current from either or both the first signal line side and/or the second signal line side to the power line side, even if, for any reason, either or both the voltage in the first signal line and/or the voltage in the second signal line has become higher than the power voltage, and therefore, when the pull up-type differential bus driver is installed in a designated semiconductor device, malfunction due to influx of current from the signal line side to the power line side can be avoided and reliability can be improved.

Moreover, according to the differential bus driving method of the present invention, by comprising a step of implementing control such that there is no influx of current from either or both the first signal line side and/or the second signal line side to the power line side in cases where either or both the voltage in the first signal line and/or the voltage in the second signal line has risen above the power voltage, it is possible to prevent influx of current from either or both the first signal line side and/or the second signal line side to the power line side, even if, for any reason, either or both the voltage in the first signal line and/or the voltage in the second signal line has risen above the power voltage, and therefore, when the pull up-type differential bus driver is installed in a designated semiconductor device, malfunction due to influx of current from the signal line side to the power line side can be avoided and reliability can be improved.

What is claimed is:

1. A differential amplifier circuit, formed in a common semiconductor substrate, for generating an amplified output by comparing inputs, comprising:

a pair of input MOS transistors of a first conductor type, the gates of which are supplied respectively with first and second inputs, the drains of which are connected respectively via load circuits to a first power source, and the sources of which are mutually connected to a first current source;

a pair of output MOS transistors of a second conductor type, the drain signal of said pair of input MOS transistors of the first conductor type being input respectively to the gates thereof and a differential output being generated at the drains thereof; and a pair of input MOS transistors of a second conductor type, the gates of which are supplied respectively with said second and first inputs, the drains of which are connected respectively to the drains of said pair of output MOS transistors, and the sources of which are connected to the first power source via a second current source.

2. A differential amplifier circuit, formed in a common semiconductor substrate, for generating an amplified output by comparing differential inputs comprising:

a first differential amplifier circuit for generating first differential outputs, to which said differential inputs are supplied; and a second differential amplifier circuit for generating second outputs, to which said first differential outputs are supplied;

wherein said first differential amplifier circuit comprises:
a pair of first input MOS transistors of a first conductor type, the gates of which are supplied respectively with said differential inputs, the drains of which are connected respectively via load circuits to a first power source, and the sources of which are mutually connected to a first current source;

a pair of output MOS transistors of a second conductor type, the drain signals of said pair of input MOS transistors of the first conductor type being input respectively to the gates thereof, and said first differential outputs being generated at the drains thereof: and a pair of second input MOS transistors of a second conductor type, the gates of which are supplied respectively with said differential inputs, the drains of which are connected respectively to the drains of said pair of output MOS transistors, and the sources of which are connected to the first power source via a second current source; and said second differential amplifier circuit comprises:
a pair of third input MOS transistors of the first conductor type, the gates of which are supplied respectively with said first differential outputs, the drains of which are connected respectively via load circuits to the first power source, and the sources of which are mutually connected; and a third current source, provided between said sources of the third input MOS transistors and the second power source, for supplying current to said sources; and said third current source supplies a first current in the case of a first state where the drive capability of the MOS transistors of the first conductor type is greater than that of the MOS transistors of the second conductor type, and supplies a second current, which is greater than said first current, in the case of a second state where the drive capability of the MOS transistors of the first conductor type is less than that of the MOS transistors of the second conductor type.

3. A differential amplifier circuit, formed in a common semiconductor substrate, for generating an amplified output by comparing differential inputs, comprising:

a first differential amplifier circuit for generating first differential outputs, to which said differential inputs are supplied; and a second differential amplifier circuit for generating second outputs, to which said first differential outputs are supplied;

wherein said first differential amplifier circuit comprises:
a pair of first input MOS transistors of a first conductor type, the gates of which are supplied respectively with said differential inputs, the drains of which are connected respectively via load circuits to a first power source, and the sources of which are mutually connected to a first current source;

a pair of output MOS transistors of a second conductor type, the drain signals of said pair of input MOS transistors of the first conductor type being input respectively to the gates thereof, and said first differential outputs being generated at the drains thereof; and a pair of second input MOS transistors of a second conductor type, the gates of which are supplied respectively with said differential inputs, the drains of which are connected respectively to the drains of said pair of output MOS transistors, and the sources of which are connected to the first power source via a second current source; and said second differential amplifier circuit comprises:
a pair of third input MOS transistors of the first conductor type, the gates of which are supplied respectively with said first differential outputs, the drains of which are connected respectively via load circuits to the first power source, and the sources of which are mutually connected; and a third current source including a current source MOS transistor of the first conductor type provided between said sources of the third input MOS transistors and a second power source, and a bias MOS transistor of the second conductor type and a bias MOS transistor of the first conductor type, the gates and drains of which are connected, provided between said first and second power sources, the drains of said bias MOS transistors being connected to the gates of said current source MOS transistor.

* * * * *

UNITED STATES PATENT AND TRADEMARK OFFICE
CERTIFICATE OF CORRECTION

PATENT NO. : 6,275,107 B1
DATED : August 14, 2001
INVENTOR(S) : Junko Maeda et al.

It is certified that error appears in the above-identified patent and that said Letters Patent is hereby corrected as shown below:

<u>Title page,</u>
Item [73], please correct the spelling of the Assignee name as follows:
Change "Fujitisu Limited" to -- Fujitsu Limited --

Signed and Sealed this

Twenty-third Day of July, 2002

Attest:

Attesting Officer

JAMES E. ROGAN
*Director of the United States Patent and Trademark Office*